(12) United States Patent
Yanagisawa et al.

(10) Patent No.: US 9,546,422 B2
(45) Date of Patent: Jan. 17, 2017

(54) SEMICONDUCTOR DEVICE MANUFACTURING METHOD AND SUBSTRATE PROCESSING METHOD INCLUDING A CLEANING METHOD

(71) Applicant: HITACHI KOKUSAI ELECTRIC INC., Tokyo (JP)

(72) Inventors: Yoshihiko Yanagisawa, Toyama (JP); Tetsuaki Inada, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 112 days.

(21) Appl. No.: 14/387,978

(22) PCT Filed: Mar. 13, 2013

(86) PCT No.: PCT/JP2013/057086
§ 371 (c)(1),
(2) Date: Sep. 25, 2014

(87) PCT Pub. No.: WO2013/146278
PCT Pub. Date: Oct. 3, 2013

(65) Prior Publication Data
US 2015/0050815 A1    Feb. 19, 2015

(30) Foreign Application Priority Data

Mar. 30, 2012  (JP) ................. 2012-082127

(51) Int. Cl.
*C23C 16/52* (2006.01)
*C23C 16/44* (2006.01)
(Continued)

(52) U.S. Cl.
CPC ......... *C23C 16/4405* (2013.01); *C23C 16/455* (2013.01); *C23C 16/45551* (2013.01);
(Continued)

(58) Field of Classification Search
CPC ...... C23C 16/4405; C23C 16/56; C23C 16/52; H01L 21/02263
See application file for complete search history.

(56) References Cited

U.S. PATENT DOCUMENTS 4,960,488 A  * 10/1990 Law ...................... C23C 16/402
                                                              134/1
8,092,598 B2    1/2012 Baek et al.
(Continued)

FOREIGN PATENT DOCUMENTS

JP    2005-61636    *  3/2005
JP    2008-524842 A    7/2008
(Continued)

OTHER PUBLICATIONS

International Search Report, PCT/JP2013/057086, Apr. 2, 2013, 2 pgs.

*Primary Examiner* — Bret Chen
(74) *Attorney, Agent, or Firm* — Volpe and Koenig, P.C.

(57) ABSTRACT

A semiconductor device manufacturing method includes: a step wherein a processing substrate to be processed is placed on a substrate mounting member that is provided in a processing chamber having a plurality of gas supply regions; a film-forming step wherein a processing gas is supplied to the processing chamber, and the substrate is processed; a step wherein the substrate is carried out from the processing chamber; and a cleaning step wherein the density of the cleaning gas is controlled, while controlling cleaning gas quantities in the gas supply regions, respectively, in a state wherein the substrate is not placed in the processing chamber.

7 Claims, 10 Drawing Sheets

(51) Int. Cl.
  *C23C 16/455* (2006.01)
  *H01J 37/32* (2006.01)
  *H01L 21/02* (2006.01)

(52) U.S. Cl.
  CPC ........ *C23C 16/52* (2013.01); *H01J 37/32862* (2013.01); *H01J 37/32889* (2013.01); *H01J 2237/335* (2013.01); *H01L 21/0228* (2013.01); *H01L 21/02164* (2013.01); *H01L 21/02222* (2013.01); *H01L 21/02263* (2013.01)

(56) References Cited

U.S. PATENT DOCUMENTS

| | | | | |
|---|---|---|---|---|
| 2002/0006675 | A1* | 1/2002 | Shigaraki | G03F 7/70525 438/4 |
| 2004/0015022 | A1* | 1/2004 | Ohno | B01J 23/26 570/164 |
| 2004/0250773 | A1* | 12/2004 | Hasegawa | C23C 16/46 118/724 |
| 2007/0209683 | A1* | 9/2007 | Chou | C23C 16/4407 134/21 |
| 2009/0253269 | A1* | 10/2009 | Tsuneda | C23C 16/34 438/758 |
| 2009/0314432 | A1* | 12/2009 | Iizuka | H01J 37/3244 156/345.27 |
| 2011/0226418 | A1* | 9/2011 | Ishibashi | C23C 16/4405 156/345.27 |
| 2011/0232686 | A1* | 9/2011 | Toratani | C23C 16/4405 134/21 |
| 2013/0133701 | A1* | 5/2013 | Kahlon | C11D 11/0047 134/30 |
| 2015/0176130 | A1* | 6/2015 | Koshi | H01L 21/02057 118/712 |

FOREIGN PATENT DOCUMENTS

| | | | |
|---|---|---|---|
| JP | 2008-190046 | A | 8/2008 |
| JP | 2009-263764 | * | 11/2009 |
| JP | 2010-034424 | A | 2/2010 |
| JP | 2010-153805 | A | 7/2010 |
| JP | 2012-28737 | * | 2/2012 |
| WO | 2007/116768 | A1 | 10/2007 |

* cited by examiner

SEMICONDUCTOR DEVICE MANUFACTURING METHOD AND SUBSTRATE PROCESSING METHOD INCLUDING A CLEANING METHOD

TECHNICAL FIELD

The present disclosure relates to a semiconductor device manufacturing method including a process of processing a substrate, and a substrate processing apparatus for performing a process according to a substrate processing method.

BACKGROUND

A method of manufacturing semiconductor devices such as, for example, a flash memory, a DRAM (Dynamic Random Access Memory) may include a substrate processing process for forming a thin film on a substrate. In a substrate processing apparatus for performing a relevant process, there has been known a thin film deposition apparatus having a reaction chamber in which films are simultaneously formed on a plurality of substrates mounted on a susceptor (see, e.g., Patent Document 1).

PRIOR ART DOCUMENTS

Patent Document 1: Japanese laid-open publication No. 2008-524842

However, in the above-mentioned thin film deposition apparatus, particles and by-products produced in the course of substrate processing may be adhered to a substrate mounting table and the processing chamber walls. In addition, if the substrate processing continues with the processing chamber having by-products adhered thereto, it causes by-products to be adhered to the next substrates, which may cause a quality of the substrates to deteriorate. Therefore, there is a need for a process to clean the processing chamber on a regular basis.

SUMMARY

The present disclosure provides various embodiments of a substrate processing method and an apparatus in which by-products adhered to a substrate processing chamber is able to be cleaned, and a semiconductor device manufacturing method using the same apparatus.

According to one embodiment of the present disclosure, there may be provided a method of manufacturing a semiconductor device, including the acts of: mounting a processing substrate on a substrate mounting member installed in a processing chamber having a plurality of gas supply regions; forming a film by supplying a processing gas into the processing chamber and treating the processing substrate; unloading the processing substrate from the processing chamber; and performing cleaning by, for each of the gas supply regions, controlling an amount and a density of a cleaning gas, under a state where the processing substrate is not mounted in the processing chamber.

According to another embodiment of the present disclosure, there may be provided a substrate processing method, including the acts of: mounting a processing substrate on a substrate mounting member installed in a processing chamber having a plurality of gas supply regions; forming a film by supplying a processing gas into the processing chamber and treating the substrate; unloading the processing substrate from the processing chamber; and performing cleaning by, for each of the gas supply regions, controlling an amount and a density of a cleaning gas, under a state where the substrate is not mounted in the processing chamber.

According to still another embodiment of the present disclosure, there may be provided a substrate processing apparatus, including: a substrate mounting member installed in a processing chamber having a plurality of gas supply regions; a gas supply unit configured to supply at least one of a processing gas, an inert gas and a cleaning gas into the gas supply regions; and a control part configured to, under a state where the processing substrate is mounted on the substrate mounting member in a film forming mode, enable the processing gas and the inert gas to be supplied from the gas supply unit into the gas supply regions, and also configured to, under a state where the substrate is not mounted on the substrate mounting member in a cleaning mode, control an amount and a density of the cleaning gas for each of the gas supply regions.

With the substrate processing method and apparatus and the semiconductor device manufacturing method according to the present disclosure, it is possible to form a high quality film.

DETAILED DESCRIPTION (1) Configuration of Substrate Processing Apparatus

Figure 1:
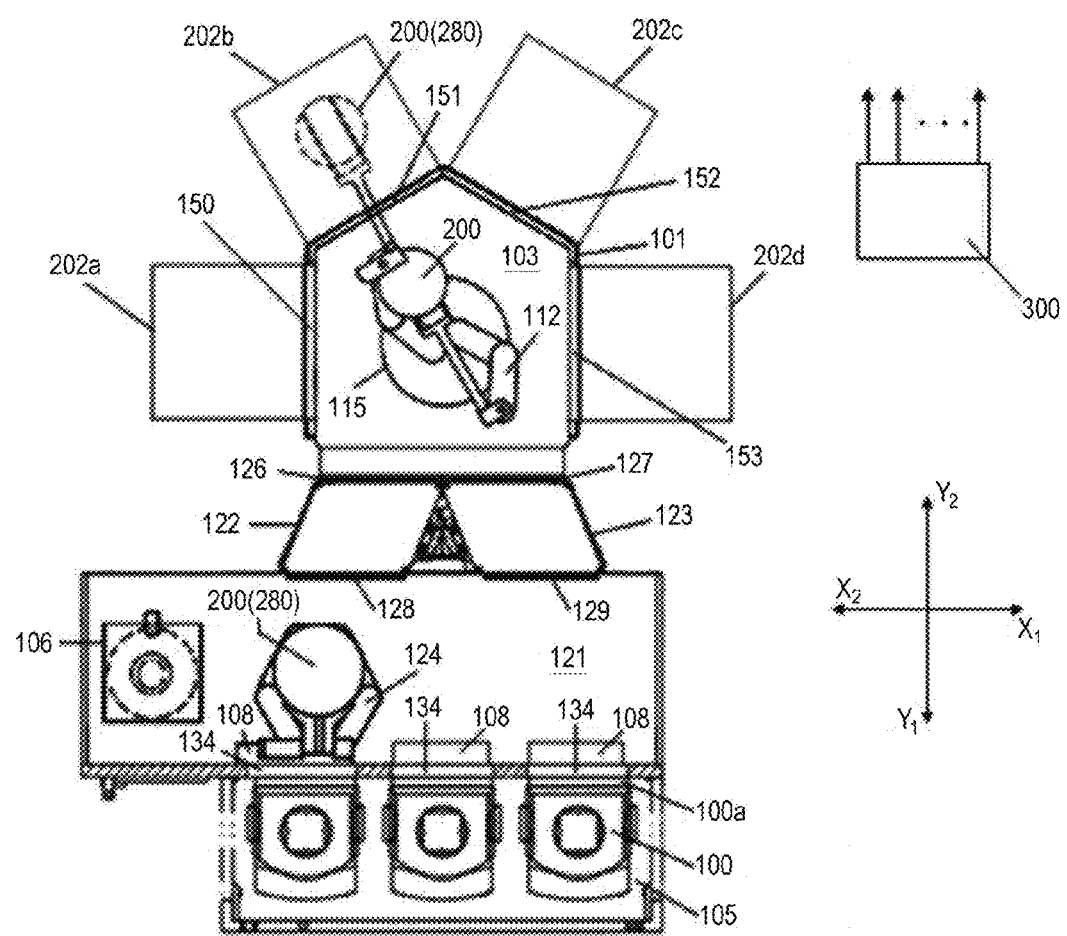
FIG. 1 is a schematic configuration view illustrating a substrate processing apparatus according to one embodiment of the present disclosure.

A configuration of a substrate processing apparatus according to an embodiment of the present disclosure will be first described with reference to FIG. 1. FIG. 1 is a schematic view illustrating a batch type substrate processing apparatus 10 according to an embodiment.

The outline of the substrate processing apparatus to which the present disclosure is applied will be described with reference to FIGS. 1 and 2.

In the substrate processing apparatus to which the present disclosure is applied, a FOUP (Front Opening Unified Pod, which will be hereinafter abbreviated as "pod") may be used as a carrier that transfers substrates such as dummy substrates 280 and substrates 200 to be processed as products. In the following description, front, rear, left and right directions are reference based on the indications provided in FIG. 1. That is, the directions X1, X2, Y1 and Y2 shown in FIG. 1 are assigned as right, left, front, and rear directions, respectively. Although this apparatus may transfer both of the substrates 200 to be processed and the dummy substrates 280, the following description will be focused on the substrates 200 to be processed, for illustration purposes.

Figure 2:
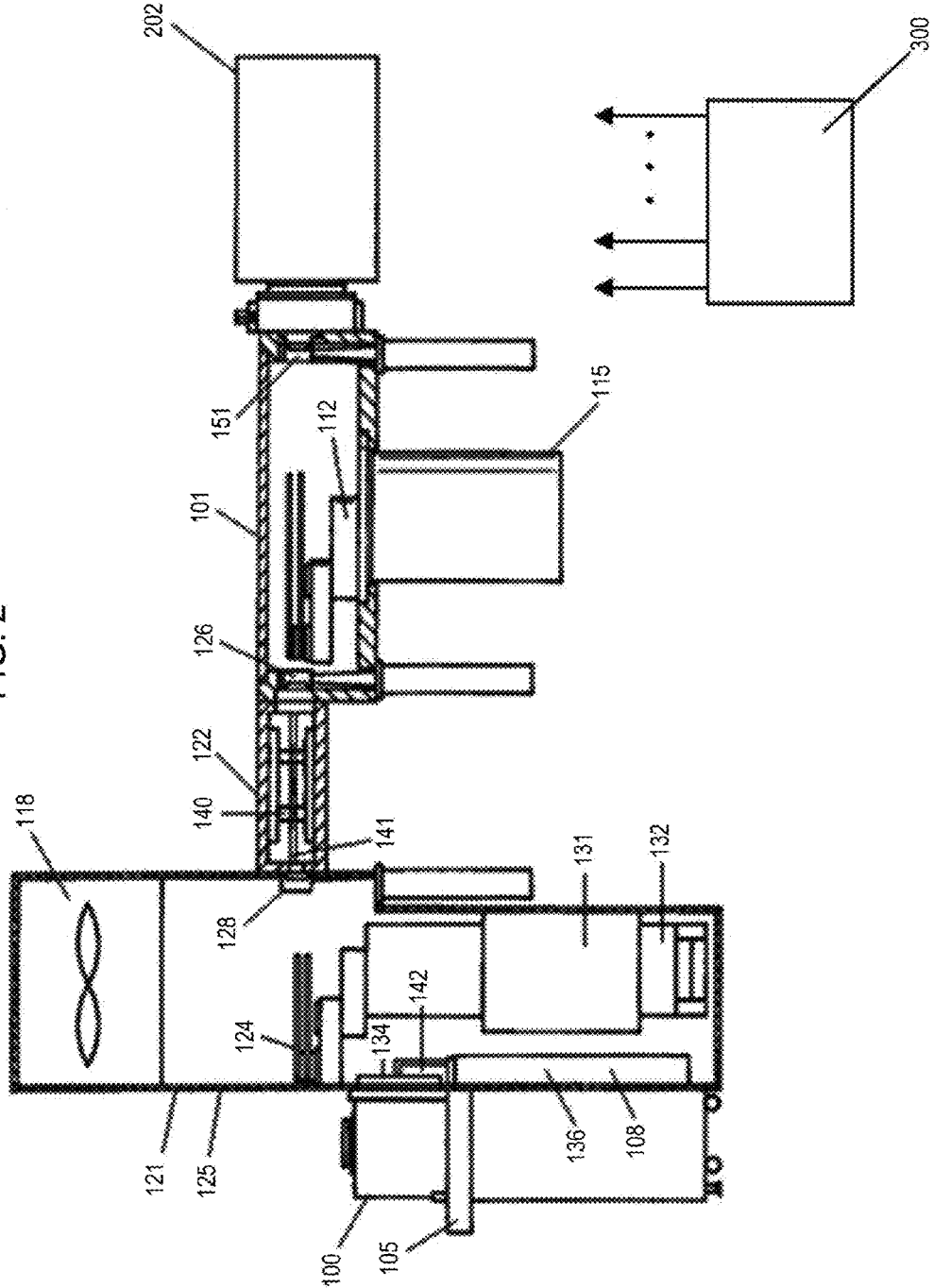
FIG. 2 is a schematic configuration view illustrating a substrate processing apparatus according to one embodiment of the present disclosure.

As shown in FIGS. 1 and 2, the substrate processing apparatus may include a first transfer chamber 103 that is configured in a load lock chamber structure whose internal pressure may be reduced to lower than an atmospheric pressure (negative pressure), such as a vacuum state or the like. The first transfer chamber 103 has a box-shape housing 101 which has a pentagonal shape when viewed from a top plane, with its upper and lower ends closed. A first substrate transfer machine 112 that is able to transfer two sheets of the substrates 200 under the negative pressure is installed within the first transfer chamber 103. Here, the first substrate transfer machine 112 may be configured to transfer one sheet of the substrate 200. The first substrate transfer machine 112 is configured to be elevated by a first substrate transfer machine elevator 115 while maintaining the airtightness of the first transfer chamber 103.

Pre-chambers 122 and 123 for carry-in and carry-out may be connected to two front side walls of the five side walls of the housing 101 via gate valves 126 and 127, respectively, and are constructed to resist the negative pressure. Further, two sheets of the substrates 200 may be stacked by a substrate support 140 in the pre-chambers (load lock chambers) 122 and 123.

A partitioning plate (intermediate plate) 141 may be installed between the substrates in the pre-chambers 122 and 123. When a plurality of processed substrates enter a pre-chamber 122 or 123, the decrease of temperature of a first-entering processed substrate that is being cooled may be delayed due to a thermal effect from a subsequent-entering processed substrate. The partitioning plate can prevent this kind of thermal interference.

Here, a general method of increasing cooling efficiency will be described next. Cooling water and chiller may flow into the partitioning plates 141 of the pre-chambers 122 and 123 to maintain their low wall temperatures, thereby increasing the cooling efficiency for the processed substrate that enters any of slots. In addition, in the negative pressure, if a distance between the substrate and the partitioning plate is too large, the cooling efficiency by heat exchange may be decreased. Therefore, as a technique for improving the cooling efficiency, a driving mechanism may be installed with relation to the substrate support (pins), which may elevate the substrate support to approach the walls of the pre-chambers.

A second transfer chamber 121 almost under atmospheric pressure is connected to the front sides of the pre-chambers 122 and 123 via gate valves 128 and 129. A second substrate transfer machine 124 to transfer the substrates 200 is installed within the second transfer chamber 121. The second substrate transfer machine 124 is configured to be elevated by a second substrate transfer machine elevator 131 and to be enabled to reciprocate in the horizontal direction by a linear actuator 132.

As shown in FIG. 1, a notch or orientation flat aligner 106 may be installed on the left side in the second transfer chamber 121. In addition, as shown in FIG. 2, a clean unit 118 for supplying clean air may be installed at the top of the second transfer chamber 121.

As shown in FIGS. 1 and 2, substrate carrying-in/out ports 134 for carrying the substrates 200 into/out of the second transfer chamber 121, and respective pod openers 108 are disposed in the front side of a housing 125 of the second transfer chamber 121. A load port (IO stage) 105 is disposed in the opposite side of the pod opener 108, that is, in the outside of the case 125, with the substrate carrying-in/out port 134 interposed therebetween. Each pod opener 108 includes a closure 142 that is capable of opening/closing a cap 100a of a pod 100 and blocking the substrate carrying-in/out port 134, and a driving mechanism 136 for driving the closure 142. The pod opener 108 may allow the substrates 200 to be inserted in and removed from the pod 100 by opening/closing the cap 100a of the pod 100 placed in the load port 105. In addition, the pod 100 may be supplied in and discharged from the load port 105 by means of an intra-process transfer device (OHT or the like) (not shown). The substrates 200 may include processing substrates 200a to be processed in the substrate processing apparatus and dummy substrates 280 to be used in a cleaning process.

As shown in FIG. 1, a first treatment furnace 202a, a second treatment furnace 202b, a third treatment furnace 202c and a fourth treatment furnace 202d where the substrates are subjected to desired processes are respectively connected adjacently to four back (rear) side walls of the five side walls of the first transfer chamber housing 101 via gate valves 150, 151, 152 and 153.

A processing process by the above-explained substrate processing apparatus will now be described. The following operations may be controlled by a controller 300, as shown in FIGS. 1 and 2. The controller 300 controls the overall operations of the apparatus in the above-described configuration. The below description is directed to the processing substrates 200a by way of example.

The pod 100 having up to 25 sheets of substrates 200 is transferred by the intra-process transfer device to the substrate processing apparatus for processing the substrates. As shown in FIGS. 1 and 2, the transferred pod 100 is delivered from the intra-process transfer device and is held on the load port 105. The cap 100a of the pod 100 is removed by the pod opener 108 and a substrate gateway of the pod 100 is opened.

When the pod 100 is opened by the pod opener 108, the second substrate transfer machine 124 installed in the second transfer chamber 121 picks up a processing substrate 200a from the pod 100, carries it in the pre-chamber 122, and transfers it to the substrate support 140. During this transfer work, the gate valve 126 of the pre-chamber 122 in the side of the first transfer chamber 103 remains closed and the negative pressure of the first transfer chamber 103 is maintained. When completing the transfer of the processing substrate 200a housed in the pod 100 to the substrate support 140, the gate valve 128 is closed and the pre-chamber 122 is exhausted to the negative pressure by means of an exhauster (not shown).

When the internal pressure of the pre-chamber 122 reaches a preset value, the gate valve 126 is opened so that the pre-chamber 122 and the first transfer chamber 103 communicate. Subsequently, the first substrate transfer machine 112 of the first transfer chamber 103 carries the processing substrate 200a from the substrate support 140 into the first transfer chamber 103. After the gate valve 126 is closed, the gate valve 151 is opened to allow the first transfer chamber 103 to communicate with the second treatment furnace 202b. After the gate valve 151 is closed, a processing gas is fed into the second treatment furnace 202b for subjecting the processing substrate 200a to a desired treatment.

When the treatment for the processing substrate 200a in the second treatment furnace 202b is completed, the gate valve 151 is opened and the processing substrate 200a is carried into the first transfer chamber 103 by the first substrate transfer machine 112. Thereafter, the gate valve 151 is closed.

Subsequently, the gate valve 127 is opened and the first substrate transfer machine 112 transfers the processing substrate 200a carried out of the second treatment furnace 202b to the substrate support 140 of the pre-chamber 123 where the treated processing substrate 200a is cooled.

When a preset cooling time elapses after the treated processing substrate 200a is transferred into the pre-chamber 123, the pre-chamber 123 returns to the almost atmospheric pressure by an inert gas. When the pre-chamber 123 returns to the almost atmospheric pressure, the gate valve 129 is opened and the cap 100a of the empty pod 100 held on the load port 105 is opened by the pod opener 108.

Subsequently, the second substrate transfer machine 124 of the second transfer chamber 121 carries the processing substrate 200a from the substrate support 140 into the second transfer chamber 121 and put the processing substrate 200a in the pod 100 through the substrate carrying-in/out port 134 of the second transfer chamber 121.

Here, the cap 100a of the pod 100 may remain opened until up to 25 substrates are returned. In addition, the substrate may be returned to the pod from which the substrate has been carried, instead being put in the empty pod 100.

When the 25 sheets of treated processing substrates 200a are completely accommodated in the pod 100 by repeating the above operation, the cap 100a of the pod 100 is closed by the pod opener 108. The closed pod 100 is transferred by the intra-process transfer device from the load port 105 for a next process.

Although the above operation has been described with a case where the second treatment furnace 202b and the pre-chambers 122 and 123 are used, it is noted that the same operation may be performed for the first treatment furnace 202a, the third treatment furnace 202c and the fourth treatment furnace 202d.

In addition, although the above operation has been described for the four processing chambers, without being limited thereto, the number of processing chambers may be determined depending on the types of corresponding substrates or films to be formed.

In addition, in the above description of the substrate-processing apparatus, although the pre-chamber 122 has been used for carrying-in and the pre-chamber 123 has been used for carrying-out, the pre-chamber 123 may be used for carrying-in and the pre-chamber 122 may be used for carrying-out. The pre-chamber 122 or the pre-chamber 123 may be used for both of carrying-in and carrying-out.

In this regard, if the pre-chamber 122 and the pre-chamber 123 are respectively dedicated to the carrying-in and the carrying-out, it is possible to reduce cross contamination. Alternatively, if the pre-chamber 122 and the pre-chamber 123 are used in combination, it is possible to improve substrate transfer efficiency.

In addition, the same treatment may be performed in all treatment furnaces or each different treatment may be performed in each different treatment furnace. For example, if a treatment in a first treatment furnace 202a is different from a treatment in a second treatment furnace 202b, the processing substrate 200a may be first treated in the first treatment furnace 202a and a different treatment may be then performed in the second treatment furnace 202b. When the different treatment is performed in the second treatment furnace 202b after the treatment of the processing substrate 200a in the first treatment furnace 200a, the substrate 200a may pass through the pre-chamber 122 or the pre-chamber 123.

At least, the treatment furnaces 202a and 202b may establish a connection therebetween. In addition, up to 4 connections may be established among any combinations of treatment furnaces 202a to 202d, for example, treatment furnaces 202c and 202d.

In addition, the number of substrates to be processed in the apparatus may be one or more. Similarly, the number of substrates to be cooled in the pre-chamber 122 or 123 may be one or more. The number of processed substrates to be cooled may be optional within up to four substrates which can be input into slots of the pre-chambers 122 and 123.

In addition, while the treated substrate is loaded and cooled in the pre-chamber 122, the gate valve of the pre-chamber 122 may be opened to load a substrate into a treatment furnace for performing a substrate treatment. Similarly, while the treated substrate is loaded and cooled in the pre-chamber 123, the gate valve of the pre-chamber 123 may be opened to load a substrate into a treatment furnace for a substrate treatment.

If the gate valve at the almost atmospheric pressure is opened without a sufficient period of time for cooling, the pre-chamber 122 or 123 or adjacent electrical components may be damaged due to radiation heat of the treated substrate 200a. Therefore, in case of cooling the heated substrate, while the treated substrate having large radiation heat is loaded and is being cooled in the pre-chamber 122, the gate valve of the pre-chamber 123 may be opened to load a substrate into a treatment furnace for a substrate treatment. Similarly, while the treated substrate is loaded and cooled in the pre-chamber 123, the gate valve of the pre-chamber 122 may be opened to load a substrate into a treatment furnace for a substrate treatment.

(2) Configuration of Process Chamber

Figure 3:
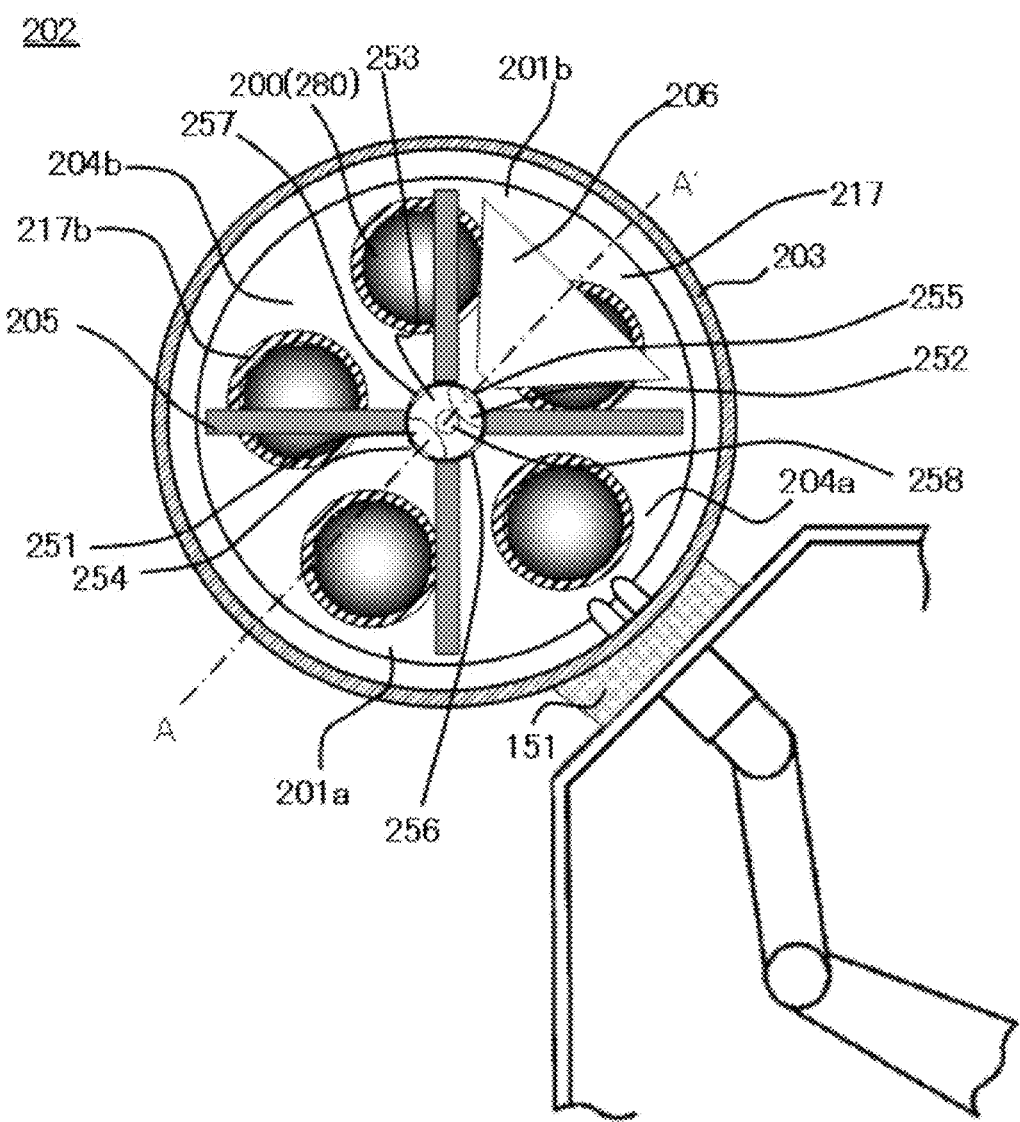
FIG. 3 is a schematic view illustrating a substrate processing chamber according to one embodiment of the present invention.
Figure 4:
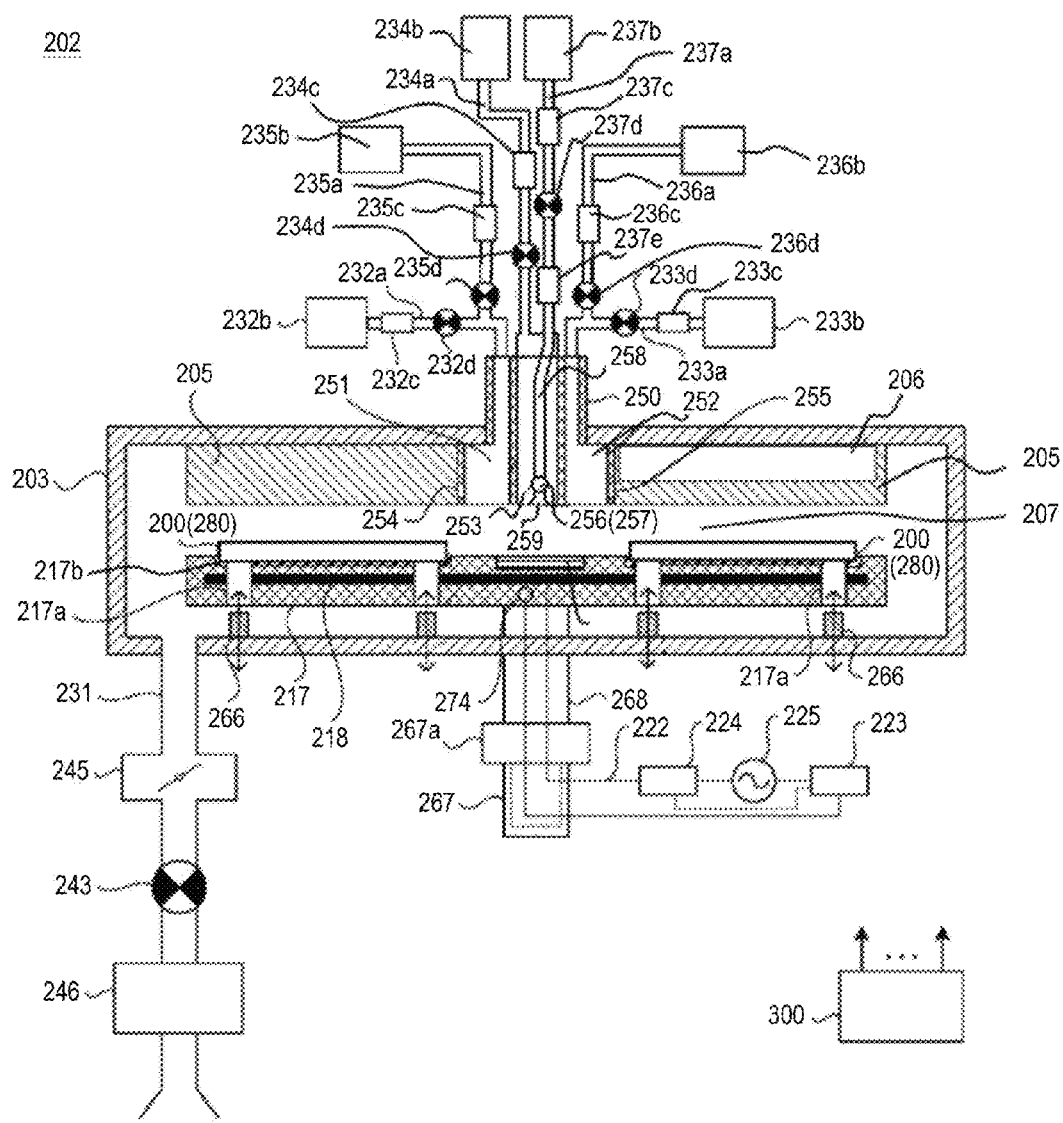
FIG. 4 is a schematic view for illustrating a substrate processing chamber according to one embodiment of the present disclosure.

Subsequently, a configuration of a process chamber 202 serving as a treatment furnace according to this embodiment will be described next with reference to FIGS. 3 and 4 mainly. FIG. 3 is a schematic perspective view of a reaction container according to this embodiment. FIG. 3 is a schematic cross-sectional view of a treatment furnace according to an embodiment. FIG. 4 is a schematic longitudinal-sectional view of the treatment furnace according to this embodiment, which is taken along line A-A' of the treatment furnace shown in FIG. 3. The following description will be directed to the processing substrate 200a by way of example.
(Reaction Container)

As shown in FIGS. 3 and 4, the process chamber 202 serving as a treatment furnace includes a cylindrical sealed reaction container 203. The reaction container 203 is provided therein with a processing space 207 for the processing substrate 200a. Four partitioning plates 205 extending radially from the center are installed in the upper side of the processing space 207 of the reaction container 203. The four partitioning plates 205 partition the processing space 207 into a plurality of gas supply regions, specifically, a first processing region 201a, a first purge region 204a, a second processing region 201b and a second purge region 204b. The first processing region 201a, the first purge region 204a, the second processing region 201b and the second purge region 204b are arranged in this order along the rotational direction of a susceptor (substrate mounting table) 217 which will be described later.

As will be described later, by rotating the susceptor 217, the processing substrate 200a held on the susceptor 217 is moved to the first processing region 201a, the first purge region 204a, the second processing region 201b and the second purge region 204b in this order. In addition, as will be described later, a first processing gas as a first gas is supplied into the first processing region 201a, a second processing gas as a second gas is supplied into the second processing region 201b, and an inert gas is supplied into the first purge region 204a and the second purge region 204b. Thus, by rotating the susceptor 217, the first processing gas, the inert gas, the second processing gas and the inert gas are supplied in this order onto the processing substrate 200a. The detailed configuration of the susceptor 217 and a gas supply system will be described later.

Between end portions of the partitioning plates 205 and a side wall of the reaction container 203 is provided an opening having a predetermined width through which a gas can pass. By ejecting an inert gas from the first purge region 204a and the second purge region 204b toward the first processing region 201a and the second processing region 201b through this opening, it is possible to prevent a processing gas from being introduced into the first purge region 204a and the second purge region 204b, thereby preventing reaction of the processing gas.

Although an angle formed between the partitioning plates 205 is 90 degrees in this embodiment, the present disclosure is not limited thereto. That is, this angle may be appropriately changed in consideration of supply time of various gases to the processing substrate 200a, such as, for example, increasing the angle of two partitioning plates 205 defining the second processing region 201b.

In addition, although the processing regions are partitioned by the partitioning plates 205 in this embodiment, without being limited thereto, any other structure may be adapted as long as it allows gases supplied into the processing regions 201a and 201b not to be mixed with each other.

(Susceptor)

As shown in FIGS. 3 and 4, below the partitioning plates 205, i.e., in the center of the bottom side of the reaction container 203, is installed the susceptor 217 serving as a rotatable substrate support with its rotational axis center coinciding with the center of the reaction container 203. The susceptor 217 is made of non-metallic material, such as aluminum nitride (AlN), ceramics, quartz or the like, to reduce metallic contamination of the processing substrate 200a. In addition, the susceptor 217 is electrically isolated from the reaction container 203.

The susceptor 217 is configured to support a plurality of (for example, 5 in this embodiment) processing substrates 200a arranged side by side on the same plane along the same circumference. It is noted that the plurality of processing substrates 200a are not necessarily arranged on the completely same plane but are allowed to be arranged in a non-overlapping manner when viewed from above the susceptor 217, as shown in FIGS. 3 and 4.

In addition, substrate mounting members 217b corresponding to the number of processing substrates 200a to be treated are installed at positions in the surface of the susceptor 217 to support the processing substrates 200a. Each of the substrate mounting members 217b may have a circular shape when viewed from top and a concave shape when viewed from side. In this case, the diameter of each substrate mounting member may be slightly larger than that of each processing substrate 200a. Mounting the processing substrate 200a in the substrate mounting member facilitates positioning of the processing substrate 200a and can prevent misregistration which may occur, for example, when the processing substrate 200a jumps out of the susceptor 217 due to a centrifugal force caused by the rotation of the susceptor 217.

A cover 219 made of plasma-resistant material is installed at a position opposing a cleaning gas supply hole 259 which will be described later, in the center of the susceptor. The cover 219 prevents the susceptor from being etched by a cleaning gas in a plasma state which will be described later. Details of the cover 219 will be described later.

As shown in FIG. 4, the susceptor 217 is provided with an elevating instrument 268 to elevate the susceptor 217. The susceptor 217 is provided with a plurality of through holes 217a. In the bottom of the reaction container 203 is installed a plurality of substrate lift pins 266 which supports the rear surfaces of the processing substrates 200a to lift the processing substrates 200a up when the processing substrates 200a are loaded/unloaded into/out of the reaction container 203. The through holes 217a and the substrate lift pins 266 are arranged in such a relative manner that the substrate lift pins 266 pass through the through holes 217a in non-contact with the susceptor 217 when the substrate lift pins 266 are ascended or when the susceptor 217 is descended by the elevating instrument 268.

The elevating instrument 268 is installed with a rotation mechanism 267 to rotate the susceptor 217. A rotary shaft (not shown) of the rotation mechanism 267 is connected to the susceptor 217. It is possible to rotate the susceptor 217 by actuating the rotation mechanism 267. The rotation mechanism 267 is connected with a control part 300 described later via a coupling part 267a. The coupling part 267a is formed as a slip ring mechanism to electrically connect a rotating side and a fixed side using a metal brush or the like. Thus, the rotation of the susceptor 217 is not disturbed. The control part 300 is configured to control a state of electrical conduction to the rotation mechanism 267 to rotate the rotation mechanism 267 at a predetermined speed for a predetermined period of time. As described above, by rotating the susceptor 217, the processing substrate 200a held on the susceptor 217 is moved to the first processing region 201a, the first purge region 204a, the second processing region 201b and the second purge region 204b in this order.

(Heating Part)

A heater 218 as a heating part is integrally buried in the susceptor 217 and is configured to heat the substrates 200. When the heater 218 is powered on, it is arranged that the surface of the processing substrate 200a is heated to a predetermined temperature (for example, about 1000° C.). In addition, a plurality of (for example, 5) heaters 218 may be installed in the same plane to individually heat the processing substrates 200a held on the susceptor 217.

The susceptor 217 is provided with a temperature sensor 274. The heater 218 and the temperature sensor 274 are electrically connected with a temperature adjustor 223, a power adjustor 224 and a heater power source 225 via a power supply line 222. A state of electrical conduction to the heater 218 is controlled based on temperature information detected by the temperature sensor 274.

(Gas Supply Unit)

On the upper side of the reaction container 203 is installed a gas supply unit 250 including a first processing gas introduction part 251, a second processing gas introduction part 252, an inert gas introduction part 253 and a cleaning gas introduction part 258. The gas supply unit 250 is air-tightly installed in an opening formed in the upper side of the reaction container 203. A first gas jet outlet 254 is formed on the side wall of the first processing gas introduction part 251. A second gas jet outlet 255 is formed on the side wall of the second processing gas introduction part 252. A first inert gas jet outlet 256 and a second inert gas jet outlet 257 are formed to face each other on the side wall of the inert gas introduction part 253. A cleaning gas supply hole 259 corresponding to an end portion of the cleaning gas introduction part 258 is formed in the bottom of the gas supply unit 250. The cleaning gas supply hole 259 is formed to be lower than the first gas jet outlet 254, the second gas jet outlet 255 and the inert gas jet outlets 256 and 257.

The gas supply unit 250 is configured to supply the first processing gas from the first processing gas introduction part 251 into the first processing region 201a, supply the second processing gas from the second processing gas introduction part 252 into the second processing region 201b, and supply the inert gas from the inert gas introduction part 253 into the first purge region 204a and the second purge region 204b. The gas supply unit 250 can supply the processing gases and the inert gas into the respective regions either individually, without being mixed, or in combination.

(Processing Gas Supply System)

A first gas supply pipe 232a is connected to the upstream side of the first processing gas introduction part 251. From the upstream side of the first gas supply pipe 232a are installed a source gas supply source 232b, a mass flow controller (MFC) 232c as a flow rate controller (flow rate control part), and a valve 232d as a switching valve in this order.

The first gas (first processing gas), for example, a silicon-containing gas, is supplied from the first gas supply pipe 232a into the first processing region 201a via the mass flow controller 232c, the valve 232d, the first processing gas introduction part 251 and the first gas jet outlet 254. An example of the silicon-containing gas may include a trisilylamine (($SiH_3$)$_3$N, abbreviated as "TSA") gas as a precursor. Here the first processing gas may be any of solid, liquid and gas phases under the room temperature and the atmospheric pressure, it is described as being in a gas phase in this embodiment. If the first processing gas is in a liquid phase under the room temperature and the atmospheric pressure, a vaporizer (not shown) may be interposed between the source gas supply source 232b and the mass flow controller 232c.

Examples of the silicon-containing gas may include a hexamethyldisilazane ($C_6H_{19}NSi_2$, abbreviation: HMDS) gas as an organic silicon material, in addition to TSA. The first gas has higher stickiness than a second gas described later.

A second gas supply pipe 233a is connected to the upstream side of the second processing gas introduction part 252. The upstream side of the second gas supply pipe 233a are installed a source gas supply source 233b, a mass flow controller (MFC) 233c as a flow rate controller (flow rate control part), and a valve 233d as a switching valve in this order.

The second gas (second processing gas or reaction gas), for example, an oxygen ($O_2$) gas as an oxygen-containing gas, is supplied from the second gas supply pipe 233a into the second processing region 201b via the mass flow controller 233c, the valve 233d, the second processing gas introduction part 252 and the second gas jet outlet 255. The oxygen gas as the second processing gas moves into a plasma state by a plasma generating unit 206 and is exposed on the processing substrate 200a. The oxygen gas as the second processing gas may be also activated by adjusting the heater 218 in a predetermined range. An example of the oxygen-containing gas may include an ozone ($O_3$) gas and vapor ($H_2O$). The second gas has lower stickiness than the first gas.

A first processing gas supply system (also referred to as a silicon-containing gas supply system) 232 is mainly constituted by the first gas supply pipe 232a, the mass flow controller 232c and the valve 232d. It may be considered that the source gas supply source 232b, the first processing gas introduction part 251 and the first gas jet outlet 254 are included in the first processing gas supply system. A second processing gas supply system (also referred to as an oxygen-containing gas supply system) 233 is mainly constituted by the second gas supply pipe 233a, the mass flow controller 233c and the valve 233d. It may be considered that the source gas supply source 233b, the second processing gas introduction part 252 and the second gas jet outlet 255 are included in the second processing gas supply system. A processing gas supply system is mainly constituted by the first gas supply system and the second gas supply system.

(Inert Gas Supply System)

A first inert gas supply pipe 234a is connected to the upstream side of the inert gas introduction part 253. From the upstream direction of the first inert gas supply pipe 234a are installed an inert gas supply source 234b, a mass flow controller (MFC) 234c as a flow rate controller (flow rate control part), and a valve 234d as a switching valve in this order.

An inert gas, for example, a nitrogen ($N_2$) gas, is supplied from the first inert gas supply pipe 234a into the first purge region 204a and the second purge region 204b via the mass flow controller 234c, the valve 234d, the inert gas introduction part 253, the first inert gas jet outlet 256 and the second inert gas jet outlet 257. The inert gas supplied into the first purge region 204a and the second purge region 204b acts as a purge gas in a film forming process (S106) described later. An example of the inert gas may include inert gases such as a helium (He) gas, neon (Ne) gas and argon (Ar) gas, in addition to the $N_2$ gas.

The downstream end of a second inert gas supply pipe 235a is connected to the downstream side of the valve 232d of the first gas supply pipe 232a. An inert gas supply source 235b, a mass flow controller (MFC) 235c as a flow rate controller (flow rate control part), and a valve 235d as a switching valve are installed in this order from the upstream direction.

An inert gas, for example, an $N_2$ gas, is supplied from the second inert gas supply pipe 235a into the first processing region 201a via the mass flow controller 235c, the valve 235d, the first gas supply pipe 232a, the first gas introduction part 251 and the first gas jet outlet 254. The inert gas supplied into the first processing region 201a may act as a carrier gas or a dilution gas in the film forming process (S106).

The downstream end of a third inert gas supply pipe 236a is connected to the downstream side of the valve 233d of the second gas supply pipe 233a. An inert gas supply source 236b, a mass flow controller (WC) 236c as a flow rate controller (flow rate control part), and a valve 236d as a switching valve are installed in this order from the upstream direction.

An inert gas, for example, an $N_2$ gas, is supplied from the third inert gas supply pipe 236a into the second processing region 201b via the mass flow controller 236c, the valve 236d, the second gas supply pipe 233a, the second gas introduction part 252 and the second gas jet outlet 255. Like the inert gas supplied into the first processing region 201a, the inert gas supplied into the second processing region 201b may act as a carrier gas or a dilution gas in the film forming process (S106).

A first inert gas supply system 234 is mainly constituted by the first inert gas supply pipe 234a, the inert gas supply source 234b, the mass flow controller 234c and the valve 234d. It may be considered that the inert gas introduction part 253, the first inert gas jet outlet 256 and the second inert gas jet outlet 257 are included in the first inert gas supply system.

A second inert gas supply system 235 is mainly constituted by the second inert gas supply pipe 235a, the inert gas supply source 235b, the mass flow controller 235c and the valve 235d. It may be considered that the inert gas supply source 235b, the mass flow controller 235c, the first gas supply pipe 232a, the first gas introduction part and the first gas jet outlet are included in the second inert gas supply system.

A third inert gas supply system 236 is mainly constitute by the third inert gas supply pipe 236a, the inert gas supply source 236b, the mass flow controller 236c and the valve 236d. It may be considered that the inert gas supply source 236b, the mass flow controller 236c, the second gas supply pipe 233a, the second gas introduction part 252 and the second gas jet outlet 255 are included in the third inert gas supply system. An inert gas supply system is mainly constituted by the first to third inert gas supply systems.

(Cleaning Gas Supply System)

A cleaning gas supply pipe 237a is connected to the upstream side of the cleaning gas introduction part 258. From the upstream side of the cleaning gas supply pipe 237a are installed a cleaning gas supply source 237b, a mass flow controller (MFC) 237c as a flow rate controller (flow rate control part), a valve 237d as a switching valve, and a plasma generating unit 237e in this order.

A cleaning gas, for example, a nitrogen trifluoride ($NF_3$) gas, is supplied from the first gas supply pipe 232a. The cleaning gas is supplied into the reaction container 203 via the mass flow controller 237c, the valve 237d, the remote plasma generating unit 237e, a cleaning gas introduction part 258 and a cleaning gas supply hole 259. The cleaning gas moves into a plasma state by the remote plasma generating unit 237e.

As shown in FIG. 3, the cleaning gas introduction part 258 is interposed between the first processing gas introduction part 251 and the second processing gas introduction part 252 in the center of the inert gas introduction part 253.

(Cover)

The plasma-resistant cover 219 installed in the center of the susceptor to face the cleaning gas supply hole 259 described later.

When the processing substrate 200a is treated in the apparatus, deposits produced by gas liquefaction or solidification or by-products produced by a gas reaction may adhere to the wall of the processing chamber in contact with the gas or the susceptor 217.

Figure 5:
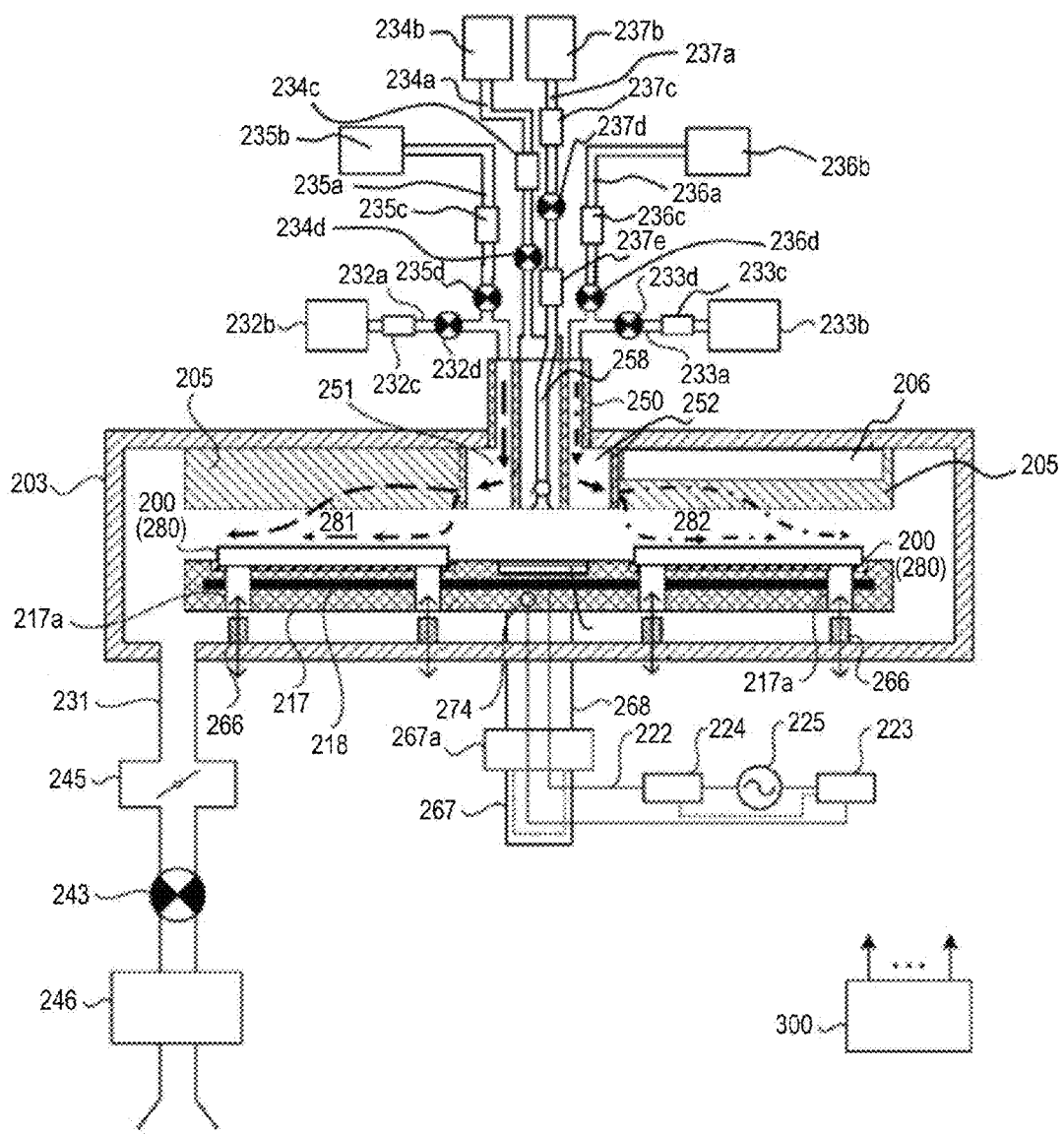
FIG. 5 is another schematic view for illustrating a flow of a processing gas in a substrate processing apparatus according to one embodiment of the present disclosure.

In the apparatus of this example, as shown in a processing gas flow diagram of FIG. 5, a first processing gas 281 is supplied from the first gas jet outlet 254 onto the processing substrate 200a. Accordingly, substance to be cleaned away is adhered to a processing chamber wall in the first processing region and/or the susceptor 217.

A second processing gas 282 is jetted from the second gas jet outlet 255 and moves into a plasma state by the plasma generating unit 206 to be supplied onto the processing substrate 200a. At that time, films and further by-products are respectively formed and produced at sites other than the processing substrate 200a by the second gas reacting with the first gas attached to the susceptor.

Figure 6:
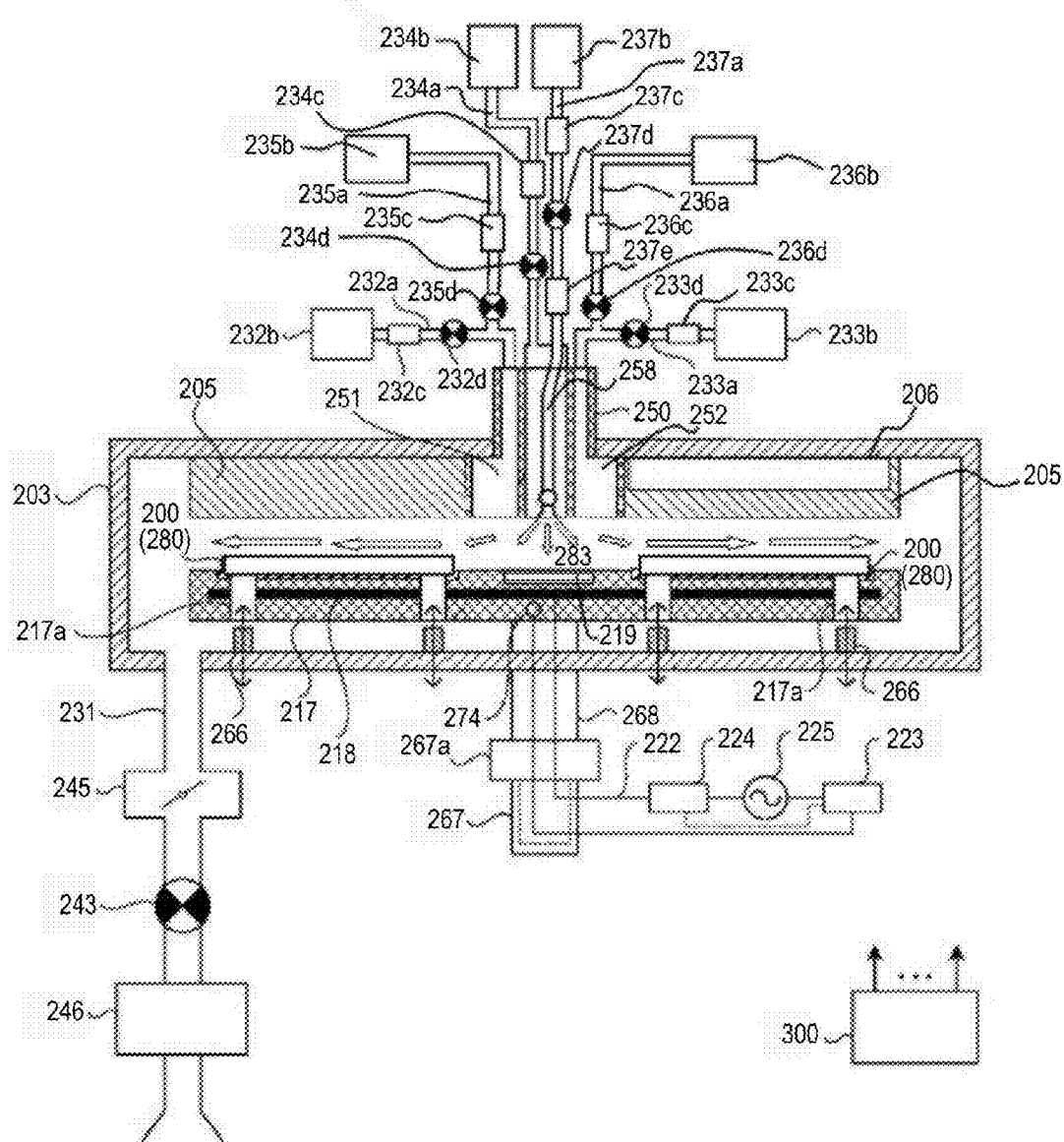
FIG. 6 is another schematic view for illustrating a flow of a cleaning gas in a substrate processing apparatus according to one embodiment of the present disclosure.

In order to remove such a cleaning object, a cleaning process is performed after performing a certain number of times of the substrate processing process. As shown in a cleaning gas flow diagram of FIG. 6, the cleaning process is performed by a cleaning gas supplied from the cleaning gas supply hole 259. The cleaning gas 283 has been moved into a plasma state in advance by the plasma generating unit 237e.

A flow rate and energy of the cleaning gas are adjusted in compliance with a portion with the largest attachment amount, for example, the first processing region. Accordingly, when the cleaning gas 283 contacts a portion to which the cleaning object is not attached, the portion is etched by the cleaning gas 283, which may cause particles.

The cleaning object is not so much attached to a position opposing the cleaning gas supply hole 259 since the first gas and the second gas are not supplied to the position, as shown in FIG. 5. Accordingly, the plasma-resistant cover 219 is installed at the position opposing the cleaning gas supply hole 259. This configuration can prevent the position opposing the cleaning gas supply hole from being unduly etched.

The cover 219 is fixed by fitting to a counterbore installed in the center of the susceptor 217. Thus, it may not only prevent a deviation caused by the rotation of the susceptor 217 but also facilitate replacement of the cover 219.

The cover 219 may have a circular shape when viewed from the cleaning gas supply hole 259. Its edge is defined at a position which is not in contact with the first and second gases, and set in the radial direction toward the center of the susceptor 217 from the first gas jet outlet 254 and the second gas jet outlet 255. This configuration allows the portion to which the cleaning object has not been attached to be plasma-resistant.

(Exhaust System)

As shown in FIG. 4, an exhaust pipe 231 to exhaust the atmosphere of the processing regions 201a and 201b and the purge regions 204a and 204b is installed in the reaction container 203. The exhaust pipe 231 is connected with a vacuum pump 246 as a vacuum exhauster, via a flow rate control valve 245 as a flow rate controller (flow rate control part) to control a gas flow rate and an APC (Auto Pressure Controller) valve 243 as a pressure regulator (pressure regulating part), for performing vacuum-exhaust so that the internal pressure of the reaction container 203 reaches a predetermined pressure (degree of vacuum). The APC valve 243 is a switching valve which facilitates or stops vacuum-exhaust in the reaction container 203 by opening/closing the valve and which further facilitates pressure regulation by regulating the degree of valve opening. An exhaust system is mainly constituted by the exhaust pipe 231, the APC valve 243 and the flow rate control valve 245. The vacuum pump 246 may be included in the exhaust system.

(Control Part)

The controller 300 as a control part (control means) controls the above-described configurations.

Next, a peripheral structure of the susceptor 217 and an operation of the susceptor 217 will be described with reference to FIG. 4.

The first transfer chamber housing 101 is arranged adjacent to the reaction container 203 via one of the gate valves 150 to 153. For example, when the gate valve 151 is opened, the reaction container 203 communicates to the first transfer chamber housing 101. The first substrate transfer machine 112 transfers the processing substrate 200a from the pod to the mounting members 217b of the susceptor 217 via the second substrate transfer machine 124.

A plurality of mounting members 217b to mount the processing substrate 200a may be formed in the susceptor 217. In this embodiment, five mounting members 217b are installed at a regular interval (for example, a 72° interval) in the clockwise direction and are rotated together when the susceptor 217 is rotated.

(3) Substrate Processing Process

Figure 7:
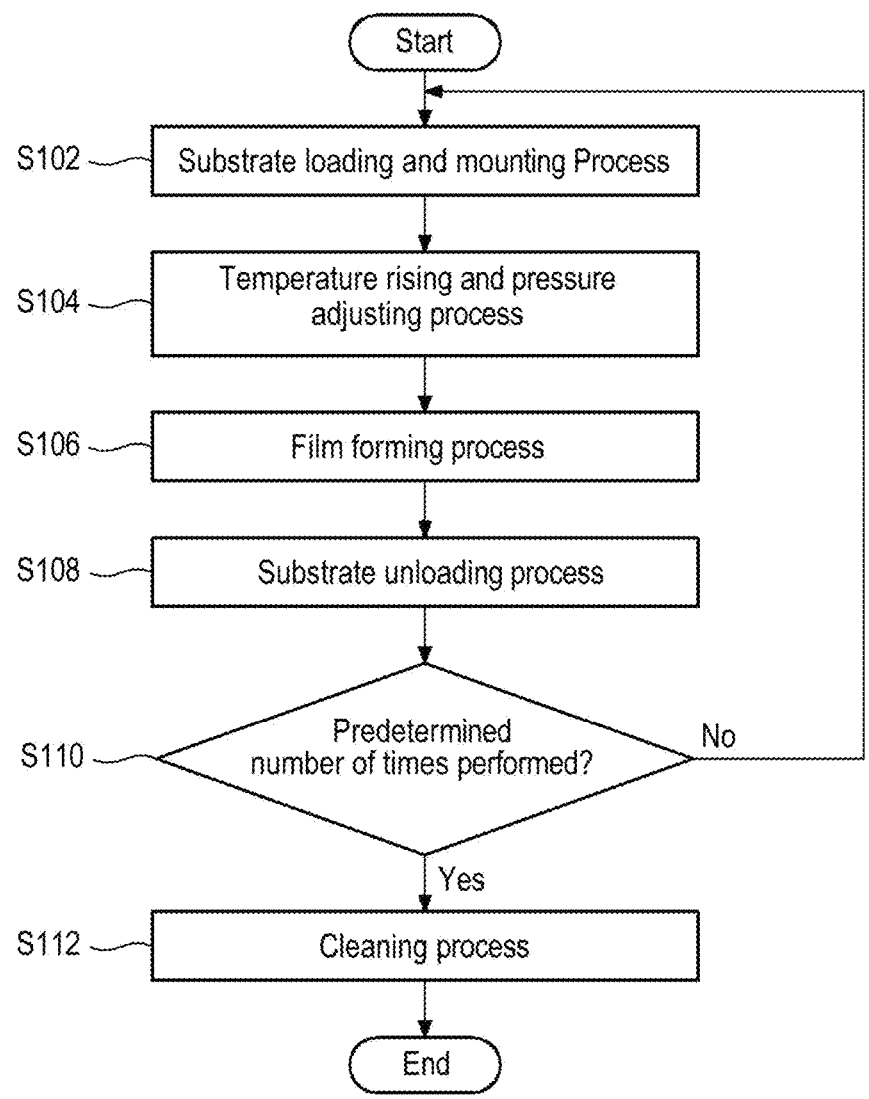
FIG. 7 is a flow chart for showing a substrate processing process according to one embodiment of the present disclosure.
Figure 8:
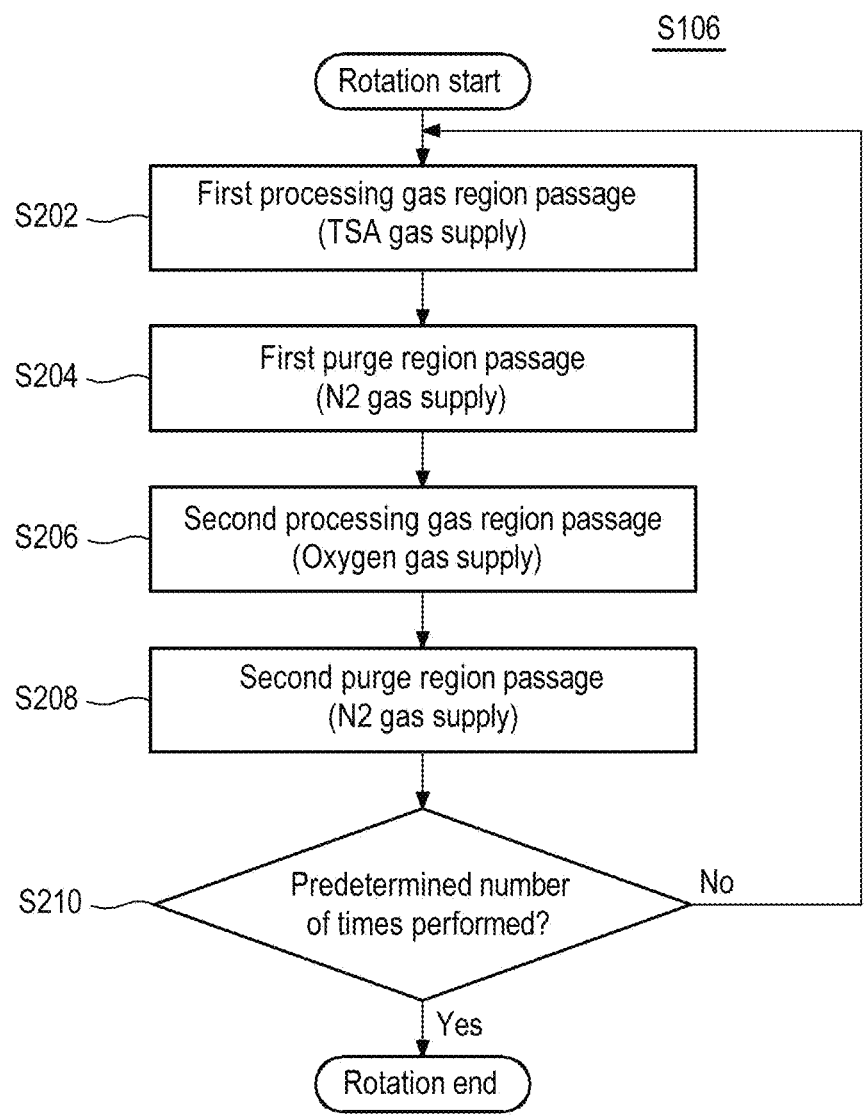
FIG. 8 is another flow chart for showing a film forming process according to one embodiment of the present disclosure.
Figure 9:
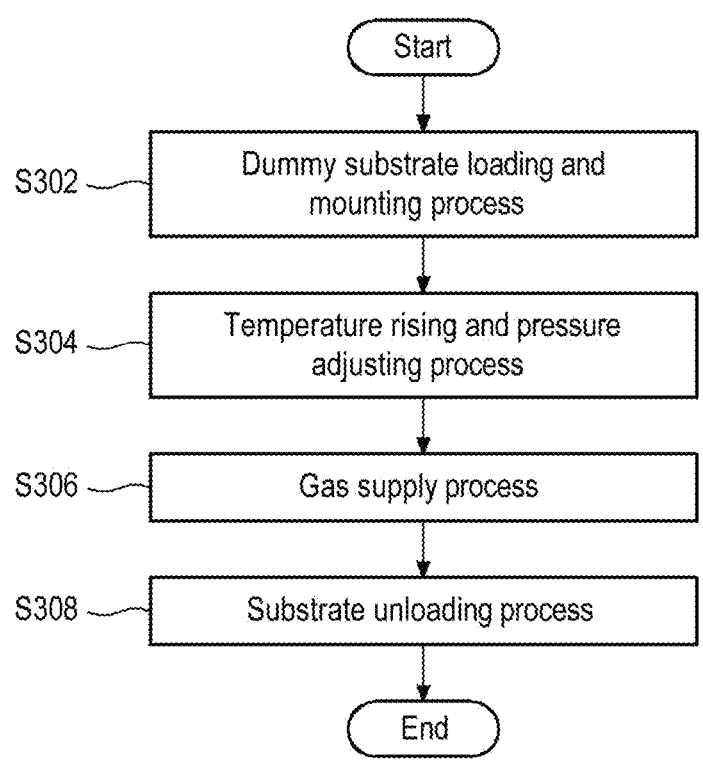
FIG. 9 is yet another flow chart for showing a cleaning process according to one embodiment of the present disclosure.
Figure 10:
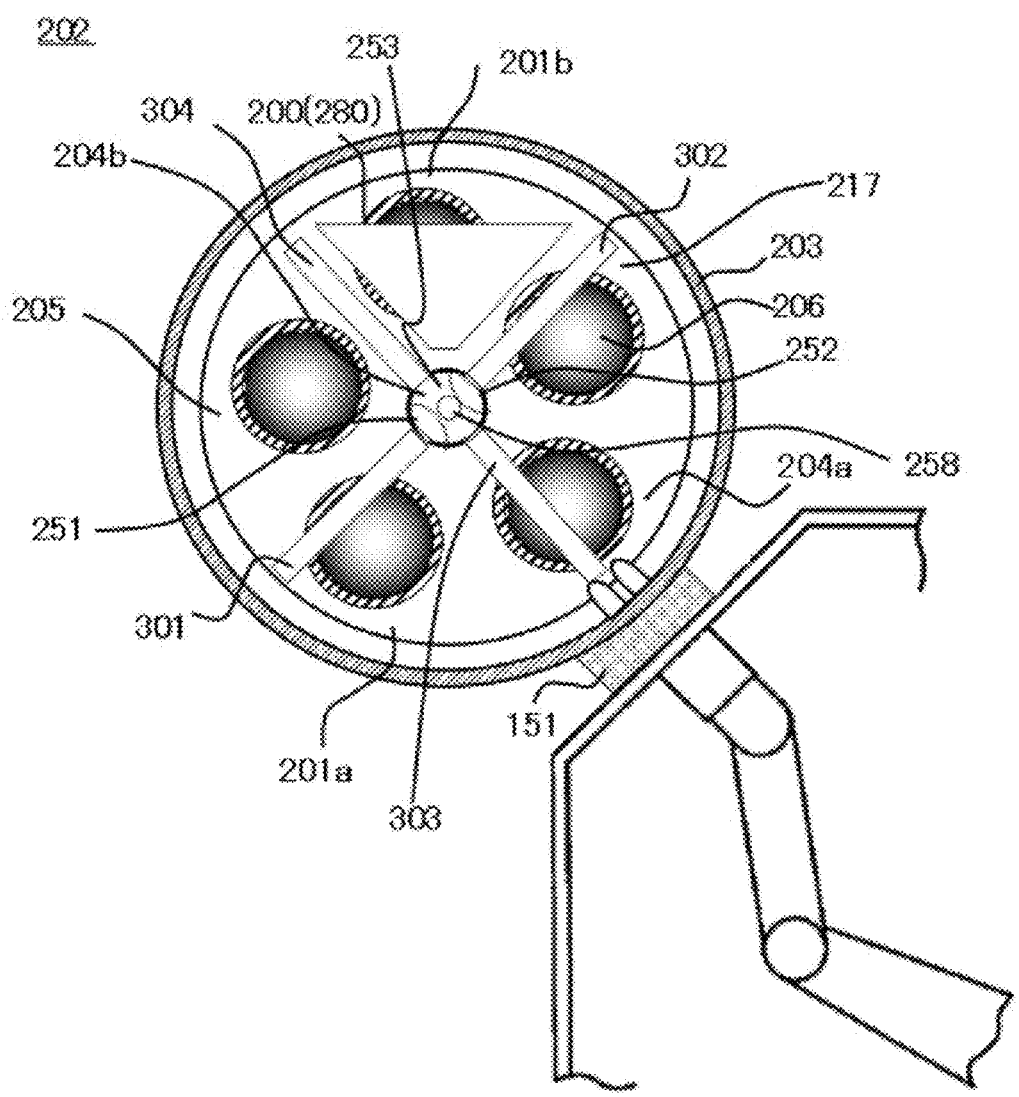
FIG. 10 is another schematic view for illustrating a substrate processing chamber according to another embodiment of the present disclosure.

As one process of the semiconductor manufacturing method according to this embodiment, a substrate processing process performed using a process chamber 202 including the above-described reaction container 203 will be described next with reference to FIGS. 7 and 8. FIG. 7 is a flow chart for illustrating a substrate processing process according to one embodiment and FIG. 8 is a flow chart for illustrating substrate processing in a film forming process in the substrate processing process according to one embodiment. In the following description, operations of various components of the process chamber 202 of the substrate processing apparatus 10 are controlled by the control part 300.

An example of forming a SiO film as an insulating film on a processing substrate 200a using trisilylamine (TSA), which is a silicon-containing gas, as the first gas and an oxygen gas, which is an oxygen-containing gas, as the second processing gas will be described below. Among the processes, at least a temperature rising and pressure adjusting process (S104) to film forming process (S108), as a film forming mode, are controlled by the control part 300. Among the processes, a cleaning process (S112), as a cleaning mode, is controlled by the control unit 300.

(Substrate Loading and Mounting Process (S102))

First, the substrate lift pins 266 are ascended to pass through the through holes 217a of the susceptor 217 to reach a transfer position of the processing substrate 200a. As a result, the substrate left pins 266 protrude by a predetermined height from the surface of the susceptor 217. Subsequently, the gate valve 151 is opened and the first substrate transfer machine 112 is used to load a predetermined number of (for example, five) processing substrates 200a (processing substrates) into the reaction container 203. Then, the processing substrates 200a are loaded on the same plane of the susceptor 217 in a non-overlapping manner around a rotary shaft (not shown) of the susceptor 217. Thus, the processing substrates 200a are supported in a horizontal position on the substrate lift pins 266 protruding from the surface of the susceptor 217.

After the processing substrates 200a are loaded into the reaction container 203, the first substrate transfer machine 112 is evacuated out of the reaction container 203 and the gate valve 151 is closed to seal the reaction container 203. Thereafter, the substrate lift pins 266 are descended and the processing substrates 200a are mounted on the mounting members 217b installed in the susceptor 217 of the bottoms of the first processing region 201a, the first purge region 204a, the second processing region 201b and the second purge region 204b.

When the processing substrates 200a are loaded into the reaction container 203, a $N_2$ gas as a purge gas may be supplied from the inert gas supply system into the reaction container 203 while exhausting the interior of the reaction container 203 by the exhausting system. That is, while exhausting the interior of the reaction container 203 by actuating the vacuum pump 246 to open the APC valve 243, the $N_2$ gas may be supplied into the reaction container 203 by opening at least the valve 234d of the first inert gas supply system. Thus, it is possible to prevent introduction of particles into the processing regions 201 and adhesion of particles to the processing substrates 200a. Here, an inert gas may be supplied from the second inert gas supply system and the third inert gas supply system. The vacuum pump 246 keeps actuated until at least the substrate loading and mounting process (S102) to a later-described substrate unloading process (S112) are terminated.

(Temperature Rising and Pressure Adjusting Process (S104))

The heater 218 buried in the susceptor 217 is powered on and the surface of each processing substrate 200a is heated to a predetermined temperature (for example, 200° C. to 400° C.). At this time, the temperature of the heater 218 is adjusted by controlling a state of electrical conduction to the heater 218 based on the temperature information detected by the temperature sensor 274.

In heating treatment of the processing substrate 200a formed with silicon, if the surface thereof is heated to 750° C. or more, impurities may be diffused in a source region, a drain region and so on formed in the surface of the processing substrate 200a, which may result in deterioration of circuit characteristics and hence poor performance of semiconductor devices. By limiting the temperature of the processing substrate 200a as described above, it is possible to prevent impurities from being diffused in a source region, a drain region and so on formed in the surface of the processing substrate 200a, thereby preventing deterioration of circuit characteristics and poor performance of semiconductor devices.

The interior of the reaction container 203 is vacuum-exhausted by the vacuum pump 246 such that the interior of the reaction container 203 is set to a desired pressure (for example, 0.1 Pa to 300 Pa, preferably 20 Pa to 40 Pa). At this time, the internal pressure of the reaction container 203 is measured by a pressure sensor (not shown) and the degree of valve opening of the APC valve 243 is feedback-controlled based on the measured pressure information.

While heating the processing substrate 200a, the rotation mechanism 267 is actuated to rotate the susceptor 217. The rotational speed of the susceptor 217 is controlled by the control part 300. The rotational speed of the susceptor 217 is, for example, 1 rev/sec. When the susceptor 217 is rotated, the processing substrate 200a begins to move to the first processing region 201a, the first purge region 204a, the second processing region 201b and the second purge region 204b in this order and passes through these regions.

(Film Forming Process (S106))

Next, an example of forming a SiO film on the processing substrate 200a by supplying a TSA gas as the first processing gas into the first processing region 201a and supplying an oxygen gas as the second processing gas into the second processing region 201b will be described. In the following description, the TSA gas, the oxygen gas and an inert gas are supplied into the respective regions concurrently.

When the heated processing substrate 200a reaches the desired temperature and the susceptor 217 reaches the desired rotational speed, at least the valves 232d, 233d and 234d are opened to supply the processing gases and the inert gas into the respective processing regions 201 and purge regions 204. More specifically, the valve 232d is opened to supply the TSA gas into the first processing region 201a, the valve 233d is opened to supply the oxygen gas into the second processing region 201b, and the valve 234d is opened to supply the $N_2$ gas as the inert gas into the first and second purge regions 204a and 204b. At this time, the APC valve 243 is appropriately adjusted to set the internal pressure of the reaction container 203 to a range of, for example, 10 Pa to 1000 Pa. In addition, the heater 218 is set to a temperature to allow the temperature of the processing substrate 200a to fall within a range of, for example, 200° C. to 400° C.

That is, the valve 232d is opened and the TSA gas is supplied from the first gas supply pipe 232a into the first processing region 201a via the first gas introduction part 251 and the first gas jet outlet 254 and is exhausted through the exhaust pipe 231. At this time, the mass flow controller 232c is adjusted to set a flow rate of the TSA gas to a predetermined flow rate. The flow rate of the TSA gas controlled by the mass flow controller 232c is set to fall within a range of, for example, 100 sccm to 5000 sccm.

When the TSA gas is supplied into the first processing region 201a, the valve 235d may be opened and a $N_2$ gas as a carrier gas or a dilution gas may be supplied from the second inert gas supply pipe 235a into the first processing region 201a. This can promote the supply of the TSA gas into the first processing region 201a. At this time, deposits produced by gas liquefaction or solidification or by-products produced by gas reaction may adhere to walls defining the processing region 201a.

In addition, the valve 233d is opened and the oxygen gas is supplied from the second gas supply pipe 233a into the second processing region 201b via the second gas introduction part 252 and the second gas jet outlet 255 and is exhausted through the exhaust pipe 231. At this time, the mass flow controller 233c is adjusted to set a flow rate of the oxygen gas to a predetermined flow rate. The flow rate of the oxygen gas controlled by the mass flow controller 233c is set to fall within a range of, for example, 1000 sccm to 10000 sccm.

When the oxygen gas is supplied into the second processing region 201b, the valve 236d may be opened and a $N_2$ gas as a carrier gas or a dilution gas may be supplied from the third inert gas supply pipe 236a into the second processing region 201b. This can promote the supply of the oxygen gas into the second processing region 201b.

In addition, the valve 234d is opened and the $N_2$ gas which is an inert gas as a purge gas is supplied from the first inert gas supply pipe 234a into the first purge region 204a and the second purge region 204b via the inert gas introduction part 253, the first inert gas jet outlet 256 and the second inert gas jet outlet 257 and is exhausted. At this time, the mass flow controller 234c is adjusted to set a flow rate of the $N_2$ gas to a predetermined flow rate. In addition, by ejecting the inert gas from the first purge region 204a and the second purge region 204b toward the first processing region 201a and the second processing region 201b through the opening between end portions of the partitioning plates 205 and a side wall of the reaction container 203, it is possible to prevent a processing gas from being introduced into the first purge region 204a and the second purge region 204b.

At this time, between the first processing region 201a and the first purge region 204a and between the first processing region 201a and the second purge gas region 204b, since the TSA gas as the first processing gas collides with the purge gas, thus gas temperature is decreased, thereby liquefying or solidifying the gases.

With the start of supply of gas, high-frequency power is supplied from a high-frequency power source (not shown) to the plasma generating unit 206 installed above the second processing region 201b. The oxygen gas supplied into the second processing region 201b and passing under the plasma generating unit 206 moves into a plasma state in the second processing region 201b and active species contained therein are supplied onto the processing substrate 200a.

The oxygen gas has a high reaction temperature and is hard to make reaction under the processing temperature of the processing substrate 200a and the internal pressure of the reaction container 203. However, when the active species contained in the oxygen gas in the plasma state as in this embodiment are supplied, the film forming process can be performed in a temperature range of, for example, 400° C. or less. In addition, if the processing temperature required for the first processing gas is different from that required for the second processing gas, the heater 218 may be controlled in compliance with the processing gas having the lower processing temperature and the other processing gas which require the higher processing temperature may be supplied in a plasma state. When the processing substrate 200a is subjected to low temperature treatment by using the plasma in this manner, it is possible to prevent thermal damage to the processing substrate 200a which includes wirings being vulnerable to heat, such as, for example, aluminum or the like. In addition, it is possible to prevent alien substances such as products caused by incomplete reaction of the processing gas and improve homogeneity and withstand voltage characteristics of a film formed on the processing substrate 200a. Further, it is possible to improve productivity of processing substrates, such as reducing oxidation reaction time by high oxidizing power of the oxygen gas in the plasma state.

As described above, by rotating the susceptor 217, the processing substrate 200a is repeatedly moved to the first processing region 201a, the first purge region 204a, the second processing region 201b and the second purge region 204b in this order. Therefore, as shown in FIG. 8, the TSA gas supply, the $N_2$ gas supply (purge), the plasmarized oxygen gas supply and the $N_2$ gas supply (purge) are alternately performed a predetermined number of times. Details of the film forming process sequence will be described below with reference to FIG. 8.

(First Processing Gas Region Passage (S202))

First, a silicon-containing layer is formed on the processing substrate 200a by supplying the TSA gas onto the surface of the processing substrate 200a passed through the first processing region 201a and a portion of the susceptor 217 on which the substrate is not loaded.

(First Purge Region Passage (S204))

Next, the processing substrate 200a on which the silicon-containing layer is formed passes through the first purge region 204a. The $N_2$ gas as the inert gas is supplied into the first purge region.

(Second Processing Gas Region Passage (S206))

Next, the oxygen gas is supplied onto the processing substrate 200a passed through the second processing region 201b and a portion of the susceptor 217 on which the substrate is not loaded. A silicon oxide layer (SiO layer) is formed on the processing substrate 200a. That is, the oxygen gas reacts with a portion of the silicon-containing layer formed on the processing substrate 200a in the second processing region 201b. Thus, the silicon-containing layer is oxidized and modified into the SiO layer containing silicon and oxygen.

(Second Purge Region Passage (S208))

Then, the processing substrate 200a on which the SiO layer is formed in the second processing region 201b passes through the second purge region 204b. At this time, the $N_2$ gas as the inert gas is supplied into the second purge region.

(Cycle Number Check (S210))

In this way, with one revolution of the susceptor 217 as one cycle, that is, with the passage of the processing substrate 200a through the first processing region 201a, the first purge region 204a, the second processing region 201b and the second purge region 204b as one cycle, by performing this cycle at least once or more, a SiO film having a predetermined thickness can be formed on the processing substrate 200a.

A check is performed to determine whether or not the above-described cycle has been performed a predetermined number of times. When the cycle has been performed the predetermined number of times, it is determined that the SiO film reaches a desired film thickness to end the film forming process. If the cycle has not been performed the predetermined number of times, it is determined that the SiO film does not reach the desired film pressure and the process returns to S202 where the cycle continues to be performed.

When it is determined that the cycle has been performed the predetermined number of times and the SiO film having the desired thickness is formed in the processing substrate 200a, at least the valve 232d and the valve 233d are closed to stop the supply of the TSA gas and the oxygen gas into the first processing region 201a and the second processing region 201b. At this time, the supply of power to the plasma generating unit 206 is also stopped. In addition, the electrical conduction to the heater 218 is controlled or stopped to decrease the temperature. Further, the rotation of the susceptor 217 is stopped.

(Substrate Unloading Process (S108))

When the film forming process S106 is completed, the substrate is unloaded in a manner described below. First, the substrate lift pins 266 are ascended and protrude from the surface of the susceptor 217 to support the processing substrate 200a thereon. Then, the gate valve 151 is opened and the first substrate transfer machine 112 is used to unload the processing substrate 200a out of the reaction container 203, thereby completing the substrate processing process according to this embodiment. Various kinds of conditions including the temperature of the processing substrate 200a, the internal pressure of the reaction container 203, a flow rate of each gas, power applied to the plasma generating unit 206, processing time and so on are arbitrarily adjusted depending on the film material, thickness of an object to be modified, and so on.

(Check of Number of Times of Processing (S110))

At S110, a check on whether a cycle from the substrate loading and mounting process (S102) to the substrate unloading process (S108) is performed a predetermined number of times is performed. Here, the predetermined number of times refers to the number of times of performing the film forming process to reach a state where cleaning is needed. The predetermined number of times is set in advance by deriving the number of times that needs the cleaning through a simulation.

(Cleaning Process (S1120))

After the cycle from the substrate loading and mounting process (S102) to the substrate unloading process (S108) is performed the predetermined number of times, cleaning for the process chamber 202 is performed in a state where the processing substrate 200a is not mounted on the substrate mounting stand. Details of the cleaning process will be described below.

(Dummy Substrate Loading and Mounting Process (S302))

Dummy substrates are mounted on the substrate mounting members 217b of the susceptor 217 in the same order as the mounting of the processing substrates.

(Temperature Rising and Pressure Adjusting Process (S304))

The heater 218 buried in the susceptor 217 is powered on and the surface of each dummy substrate 200b is heated to a predetermined temperature.

In addition, the interior of the reaction container 203 is vacuum-exhausted by the vacuum pump 246 such that the interior of the reaction container 203 is set to a desired pressure (for example, 0.1 Pa to 300 Pa, preferably 20 Pa to 40 Pa). At this time, the internal pressure of the reaction container 203 is measured by a pressure sensor (not shown) and the degree of valve opening of the APC valve 243 is feedback-controlled based on the measured pressure information.

In addition, while heating the dummy substrate 200b, the rotation mechanism 267 is actuated to rotate the susceptor 217. The rotational speed of the susceptor 217 is controlled by the control part 300. The rotational speed of the susceptor 217 is, for example, 1 rev/sec. When the susceptor 217 is rotated, the dummy substrate 200b begins to move to the first processing region 201a, the first purge region 204a, the second processing region 201b and the second purge region 204b in this order and passes through these regions.

(Gas Supply Process (S306))

Next, a cleaning gas is supplied from the cleaning gas supply system into the reaction container 203. Concurrently, an inert gas is supplied into each processing region.

Details of this process will be described below.

When the substrate 200 is heated to reach a desired temperature and the susceptor 217 reaches a desired rotational speed, at least the valves 234d, 235d, 236d and 237d are opened to supply the inert gas into the processing regions 201 and the purge regions 204. More specifically, with the valve 232d closed and the valve 235d opened, the inert gas is supplied into the first processing region 201a. With the valve 233d closed and the valve 236d opened, the inert gas is supplied into the second processing region 201b. The valve 234d is opened to supply the inert gas into the first purge region 204a and the second purge region 204b. Next, the plasma generating unit 237e is powered on and, with the valve 237d opened, a cleaning gas in a plasma state is supplied into the reaction container 203.

At this time, the APC valve 243 is appropriately adjusted to set the internal pressure of the reaction container 203 to fall within a range of, for example, 10 Pa to 1000 Pa. In addition, the heater 218 is set to a temperature to allow the temperature of the substrate 200 to fall within a range of, for example, 200° C. to 400° C.

As described above, more deposits and by-products caused by gas reaction are adhered to the processing chamber wall of the first processing region 201a, the boundary between the first processing region 201a and the first purge region 204a and the boundary between the first processing region 201a and the second purge gas region 204b than other regions.

In the second processing region 201b, by-products produced when the first gas adsorbed or deposited on the substrate 200 and the susceptor react with the second gas may adhere to the walls and partitions of the process chamber. However, since a silicon-containing gas is less included in the second processing region 201b than the first processing region 201a and the first purge region 204a, the object to be cleaned may be less included in the second processing region 201b than the first processing region 201a and the first purge region 204a.

The first gas may be introduced into the purge regions 204 (the first purge region 204a and the second purge region 204b) from the first processing region 201a interposed therebetween. Therefore, the object to be cleaned may be less included in the second processing region 201b than the first processing region 201a, the first purge region 204a, and the second purge region 204b.

From comparison in amount of the cleaning object among the regions, the following relationship is established:

first processing region 201a>purge regions 204>second processing region 201b

A cleaning gas in the plasma state is used for the cleaning process. The amount and energy of the cleaning gas are supplied in compliance with the region having the largest amount of cleaning object. Thus, it is possible to reliably remove the cleaning object.

In this embodiment, the amount and energy of the cleaning gas are adjusted in compliance with the amount of cleaning object of the first processing region 201a.

Therefore, in a region with a smaller amount of cleaning object, the process chamber wall and the like may be etched by the plasma cleaning gas.

Accordingly, in this embodiment, the cleaning gas is preferentially supplied into a region with a larger amount of cleaning object so that there are more cleaning gas in that region. For a region with a small amount of cleaning object, the cleaning gas is less used and the more inert gas is supplied.

Specifically, when the inert gas is supplied into each region, the amount of inert gas supplied into each region is controlled by the mass flow controller.

In the first processing region 201a, the mass flow controller 235c is controlled such that the cleaning gas is evenly supplied into the processing region 201a. Specifically, the supply of inert gas is controlled such that a flow rate of the inert gas is smaller than that of the inert gas supplied into the purge gas regions 204 and the second processing region 201b. Thus, the cleaning gas is more supplied into the first processing region 201a than that supplied into the purge region 204 and the second processing region 201b, thereby increasing the density of the cleaning gas.

In the purge regions 204 adjacent to the first processing region 201a, in order to prevent the cleaning gas from being unduly supplied into the purge region 204, the mass flow controller 234c is controlled such that the more inert gas is supplied into the first purge region 204a than the first processing region 201a. Here, as described later, a flow rate of the inert gas in the first purge region 204 is smaller than that in the second processing region. By doing so, the density of the cleaning gas can be lower than that in the first processing region 201a, thereby preventing etching due to an excessive amount of cleaning gas.

In the second processing region 201b, the mass flow controller 236c is controlled to prevent a large amount of cleaning gas from being supplied into the region 201b. Specifically, the mass flow controller 236c is controlled such that a flow rate of the inert gas supplied into the second processing region 201b is larger than that in the first processing region 201b and the purge gas regions 204. Thus, the density of the cleaning gas can be smaller than that in the first processing region 201a, thereby preventing etching due to an excessive amount of cleaning gas.

A flow rate of inert gas supplied into each region is set based on data obtained by experiments. The control unit 300 controls and adjusts each mass flow controller to provide the set flow rate.

Thus, even in a region with a small amount of cleaning object, it is possible to prevent the process chamber walls and so on from being unduly etched.

In addition, even in the cleaning process, by rotating the susceptor 217, it is possible to uniformly remove cleaning objects deposited on the surface of the susceptor 217.
(Substrate Unloading Process (S308))

After performing the cleaning process for a predetermined period of time, the dummy substrate is unloaded in a manner opposite to the dummy substrate loading process.

Although, in the above embodiment, the mass flow controllers is uniformly used in the supply system to supply the inert gas into the first purge region 204a and the second purge region 204b, the present disclosure is not limited thereto. For example, mass flow controllers to control the supply of inert gas may be separately installed for each of the first purge region 204a and the second purge region 204b.

In this case, the following advantages may be considered.

In the above embodiment, deposits are produced at the boundary between the first processing region 201a and the first purge region 201a and the boundary between the first processing region 201a and the second purge gas region 201b. In particular, since the rotation of the susceptor causes the gas to be pulled to the first purge region 204a which is adjacent to the first processing region 201a in the downstream of the rotation direction, the first purge region 204a becomes to have more amount of gas and thereby more deposits than those in the second purge region 204b.

Therefore, it is desirable that the mass flow controller of the supply system of the first purge region and the mass flow controller of the supply system of the second purge region are controlled such that the flow rate of inert gas supplied into the second purge region 204b is larger than that of inert gas supplied into the first purge region 204a.

A second embodiment will be described next.
(Apparatus Configuration)

An apparatus of the second embodiment has the same configuration as that of the first embodiment except for a gas supply system.

Differences therebetween will be described below.

In the second embodiment, the first gas jet outlet 254, the second gas jet outlet 255, the first inert gas jet outlet 256 and the second inert gas jet outlet 257 in the first embodiment are replaced with a nozzle 301, a nozzle 302, a nozzle 303 and a nozzle 304, respectively.

The nozzle 301 as a first gas supply nozzle is connected to the first processing gas introduction part 251 and extends in the radial direction of the susceptor 217.

The nozzle 302 as a second gas supply nozzle is connected to the second processing gas introduction part 252 and extends in the radial direction of the susceptor 217.

The nozzle 303 as a first purge gas supply nozzle and the nozzle 304 as a second purge gas supply nozzle are connected to the purge gas introduction part 253 and extend in the radial direction of the susceptor 217.

Each of the nozzles is configured to be larger than the diameter of a substrate mounted on each mounting member 217b. This configuration allows a gas to be uniformly supplied onto the substrate 200.

(Substrate Processing Process)

The second embodiment has substantially the same substrate processing process as the first embodiment except for the following aspects.

In the film forming process and the cleaning process, a processing gas and an inert gas are supplied from the gas supply nozzle 301 instead of the first gas jet outlet 254 for supplying the purge gas, and from the gas supply nozzle 302 instead of the second gas jet outlet 255.

In addition, a purge gas is supplied from the purge gas supply nozzle 303 and the purge gas supply nozzle 304 instead of the first inert gas jet outlet 256 and the second inert gas jet outlet 257.

(6) Advantages of an Embodiment

One or more advantages may be achieved as follows.

(a) According to an embodiment, since the supply of activated cleaning gas into a region with a small amount of cleaning object can be suppressed, the region can be prevented from being unduly etched.

(b) In this embodiment, since the cover is installed at a portion where no processing gas is supplied in the surface of the susceptor, the susceptor can be prevented from being unduly etched.

(c) In this embodiment, since the cover is installed at a portion facing the cleaning gas supply hole in the surface of the susceptor, the center of the susceptor can be prevented from being unduly etched.

(d) In this embodiment, since the cover can be separated, the maintenance cycle of the susceptor can be improved.

<Other Embodiments>

Although specific embodiments of the present disclosure have been described in the above, the present disclosure is not limited to these various embodiments, but may be modified in different ways without departing from the spirit of the disclosure.

For example, although, in the above embodiments, the cleaning gas supply hole is installed at a position opposing the center of the susceptor, the cleaning gas may be separately supplied into each region.

In addition, although in the above embodiments, the silicon-containing gas and the oxygen-containing gas are used as a processing gas to form the SiO film on the substrate 200, the present disclosure is not limited thereto. For example, a hafnium (Hf)-containing gas/the oxygen-containing gas, a zirconium (Zr)-containing gas/the oxygen-containing gas and a titanium (Ti)-containing gas/the oxygen-containing gas may be used as a processing gas to form High-k films such as a hafnium oxide film (HfO film), a zirconium oxide film (ZrO film) and a titanium oxide film (TiO film) on the substrate 200. In addition, an ammonia ($NH_3$) gas as a nitrogen (N)-containing gas may be used as a processing gas to become in a plasma state, in addition to the oxygen-containing gas.

In addition, although, in the above embodiments, nitrogen trifluoride is used as the cleaning gas, the present disclosure is not limited thereto. For example, the following cleaning gases combined with the processing gas may be used.

When TSA is used as the first gas and an oxygen gas is used as the second gas, hydrogen fluoride (HF), fluorine ($F_2$) and chlorine trifluoride ($ClF_3$) may be used as the cleaning gas.

When hexamethyldisilane (HMDS) is used as the first gas and an oxygen gas is used as the second gas, $NF_3$, HF, $F_2$ and $ClF_3$ may be used as the cleaning gas.

When a trisilylamine (TSA) is used as the first gas and ammonia ($NH_3$) is used as the second gas, $NF_3$, HF, $F_2$ and $ClF_3$ may be used as the cleaning gas.

When tetrakis(ethylmethylamino)zirconium (TEMAZ) is used as the first gas and an oxygen gas is used as the second gas, boron trichloride ($BCl_3$) may be used as the cleaning gas.

In addition, although, in the above embodiments, the oxygen gas is supplied into the processing chamber and plasma is generated in the plasma generating unit 206, the present disclosure is not limited thereto. For example, a remote plasma method for generating plasma in the outside of the processing chamber or ozone having a high energy level may be used.

In addition, although, in the above embodiments, the substrate 200 is moved to a processing position and a transfer position when the substrate lift pins 266 are ascended, the substrate 200 may be moved to the processing position and the transfer position by elevating the susceptor 217 with the elevating instrument 268.

In addition, although, in the above embodiments, the amount of cleaning gas supplied into each region is controlled by controlling a flow rate of purge gas, the present disclosure is not limited thereto. A cleaning gas supply hole and a flow rate controller thereof may be separately installed in association with each region and the density of the cleaning gas may be controlled by controlling the flow rate of the cleaning gas for each region in the cleaning process by means of the cleaning gas flow rate controller for each region.

In addition, although the four gas supply regions have been described in the above embodiments, the present disclosure is not limited thereto. More than four gas supply regions may be formed depending on films to be formed.

The present disclosure will be further stated with the following supplementary aspects.

<Supplementary Note 1>

A substrate processing apparatus, including:

a substrate mounting table of a plurality of substrate mounting members on which processing substrates are mounted and that are installed in a reaction container having a plurality of processing regions;

a gas supply unit configured to supply a cleaning gas, a processing gas and an inert gas into respective processing regions; and a control part configured to, if the processing substrates are mounted on the substrate mounting table, control the processing gas and the inert gas to be supplied into the respective processing regions, and also configured to, if the processing substrates are not mounted on the substrate mounting table, control the cleaning gas and the inert gas to be adjusted and supplied for the respective processing regions.

<Supplementary Note 2>

The substrate processing apparatus of Supplementary Note 1, wherein the plurality of processing regions includes an inert gas region into which the inert gas is supplied, a first gas region into which a first gas as the processing gas is supplied, and a second gas region into which a second gas as the processing gas is supplied, and wherein the substrate mounting members pass through the respective processing regions when the substrate mounting table is rotated.

<Supplementary Note 3>

The substrate processing apparatus of Supplementary Note 1 or 2, wherein the first gas is a high-viscous material, and the second gas has a lower viscosity than the first gas, and wherein the control part is further configured to adjust flow rates of the cleaning gas and the inert gas such that the cleaning gas supplied into the first gas region is more than that supplied into the second gas supply region.

<Supplementary Note 4>

The substrate processing apparatus of any one of Supplementary Notes 1 to 3, wherein a cleaning gas supply hole of the gas supply unit is formed at a position opposing a center of the substrate mounting table.

<Supplementary Note 5>

The substrate processing apparatus of any one of Supplementary Notes 1 to 4, wherein the cleaning gas supply hole is formed at a position lower than supply holes of the first gas and the second gas.

<Supplementary Note 6>

The substrate processing apparatus of any one of Supplementary Notes 1 to 5, wherein an etching-resistant gas material member is disposed at a center of the substrate mounting table.

<Supplementary Note 7>

The substrate processing apparatus of Supplementary Note 6, wherein a counterbore is installed in the center of the substrate mounting table and the etching-resistant gas material member is disposed in the counterbore.

<Supplementary Note 8>

The substrate processing apparatus of Supplementary Note 6 or 7, wherein an edge of the etching-resistant gas material member is formed to be closer to the center of the substrate mounting table than the supply holes of the first gas and the second gas.

<Supplementary Note 9>

A method of manufacturing a semiconductor device, including acts of:

processing substrates by mounting processing substrates on a plurality of substrate mounting members provided in a substrate mounting table installed in a processing chamber having a plurality of processing regions, supplying a processing gas and an inert gas into the respective processing regions correspondingly in the processing chamber, performing predetermined processing in the processing chamber, and unloading the processed substrate from the processing chamber;

after performing the act of processing substrates a multiple number of times, performing cleaning by adjusting and supplying a cleaning gas and the inert gas for each region in the processing chamber in a state where no processing substrate is mounted on the substrate mounting members, and repeating the acts of performing cleaning and processing substrates.

<Supplementary Note 10>

A substrate processing method, including acts of:

processing substrates by mounting processing substrates on a plurality of substrate mounting members provided in a substrate mounting table installed in a processing chamber having a plurality of processing regions, supplying a processing gas and an inert gas into the respective processing regions correspondingly in the processing chamber, performing predetermined processing in the processing chamber, and unloading the processed substrate from the processing chamber;

after performing the act of processing substrates a multiple number of times, performing cleaning by adjusting and supplying a cleaning gas and the inert gas for each region in the processing chamber in a state where no processing substrate is mounted on the substrate mounting members; and repeating the acts of performing cleaning and processing substrates.

<Supplementary Note 11>

A method of manufacturing a semiconductor device, including acts of:

mounting a processing substrate on a substrate mounting member installed in a processing chamber having a plurality of gas supply regions;

forming a film by supplying a processing gas into the processing chamber and processing the processing substrate;

unloading the processing substrate from the processing chamber; and performing cleaning by, for each of the gas supply regions, controlling an amount of a cleaning gas and controlling a density of the cleaning gas, under a state where the processing substrate is not mounted in the processing chamber.

<Supplementary Note 12>

The method of Supplementary Note 11, wherein the act of performing cleaning includes supplying the cleaning gas into the plurality of gas supply regions while supplying an inert gas having a respective different flow rate into each of the gas supply regions.

<Supplementary Note 13>

The method of Supplementary Note 11 or 12, wherein the gas supply regions include a first processing region into which a first gas is supplied, and an adjacent purge region, and wherein, in the act of performing cleaning, the supply of an inert gas is controlled such that an amount of the inert gas in the purge region is larger than an amount of the inert gas in the first processing region.

<Supplementary Note 14>

The method of any one of Supplementary Note 11 to 13, wherein the act of forming a film includes forming a film on the processing substrate by passing the processing substrate through an inert gas region into which the inert gas is supplied, the first processing region into which the first gas is supplied, and a second processing region into which a second gas is supplied, when the substrate mounting table is rotated.

<Supplementary Note 15>

The method of Supplementary Note 14, wherein the first gas has a higher viscosity than that of the second gas and the supply of the inert gas is controlled such that an amount of the cleaning gas supplied into the first processing region is larger than that of the second processing region in which the second gas is supplied.

<Supplementary Note 16>

The method of any one of Supplementary Note 11 to 15, wherein the act of performing cleaning includes passing a surface of the substrate mounting table through the inert gas supply region into which the inert gas is supplied, the first processing region into which the first gas is supplied, and the second processing region into which the second gas is supplied, when the substrate mounting table is rotated.

<Supplementary Note 17>

A substrate processing method, including acts of:

mounting a processing substrate on a substrate mounting member installed in a processing chamber having a plurality of gas supply regions;

forming a film by supplying a processing gas into the processing chamber and processing the processing substrate;

unloading the processing substrate from the processing chamber; and performing cleaning by, for each of the gas supply regions, controlling an amount of a cleaning gas as well as controlling a density of the cleaning gas, under a state where the processing substrate is not mounted in the processing chamber.

<Supplementary Note 18>

A substrate processing apparatus, including:

a substrate mounting member installed in a processing chamber having a plurality of gas supply regions;

a gas supply unit configured to supply at least one of a processing gas, an inert gas and a cleaning gas into the gas supply regions; and a control part configured to control so that the processing gas and the inert gas is supplied from the gas supply unit into the gas supply regions to process a processing substrate under a state where the processing substrate is mounted on a substrate mounting member in a film forming mode, and also configured to control so that in each of the gas supply regions, an amount of cleaning gas is controlled to thereby control a density of the cleaning gas, under a state where the processing substrate is not mounted on the substrate mounting member in a cleaning mode.

EXPLANATION OF REFERENCE NUMERALS

200: substrate, 201a: first processing region, 201b: second processing region, 203: reaction container, 204a: first purge region, 204b: second purge region, 217: substrate support, 218: heater, 300: controller.

What is claimed is:

1. A method of manufacturing a semiconductor device, the method comprising:

mounting a processing substrate on a substrate mounting table member installed in a processing chamber that has a plurality of gas supply regions including a first processing region, a second processing region, a first purge region, and a second purge region, the first and second purge regions arranged between the first and second processing regions, wherein the plurality of gas supply regions are arranged radially with respect to a center of the processing chamber;

forming a film on the processing substrate by simultaneously supplying a first processing gas from a first processing as supply unit to the first processing region and a second processing gas from a second processing gas supply unit to the second processing region;

unloading the processing substrate from the processing chamber; and performing cleaning by simultaneously supplying an inert gas from a plurality of inert gas supply units to each of the plurality of gas supply regions and a cleaning gas from a cleaning gas supply unit different from the first and second processing gas supply units to all of the plurality of gas supply regions, independently controlling a flow rate of the inert gas supplied from each of the plurality of inert gas supply units to each of the plurality of gas supply regions, and controlling a density of the cleaning gas in each of the plurality of gas supply regions.

2. The method of claim 1, wherein, in the act of performing cleaning, supply of an inert gas is controlled such that a flow rate of the inert gas supplied to the first and second purge regions is larger than a flow rate of the inert gas supplied to the first processing region.

3. The method of claim 1, wherein the first processing gas has a higher viscosity than that of the second processing gas, and wherein the supply of the inert gas is controlled such that a density of the cleaning gas in the first processing region is larger than a density of the cleaning gas in the second processing region.

4. The method of claim 1, wherein the act of performing cleaning includes passing a surface of the substrate mounting table member through the first processing region, the second processing region, the first purge region, and the second purge region, when the substrate mounting table member is rotated.

5. The method of claim 1, wherein the cleaning gas is supplied from the cleaning gas supply unit to the plurality of gas supply regions through a cleaning gas supply hole located at the center of the processing chamber.

6. A substrate processing method, the method comprising:

mounting a processing substrate on a substrate mounting table member installed in a processing chamber having a plurality of gas supply regions including a first processing region, a second processing region, a first purge region, and a second purge region, the first and second purge regions arranged between the first and second processing regions, wherein the plurality of gas supply regions are arranged radially with respect to a center of the processing chamber;

forming a film on the processing substrate by simultaneously supplying a first processing gas from a first processing gas supply unit to the first processing region and a second processing gas from a second processing gas supply unit to the second processing region;

unloading the processing substrate from the processing chamber; and performing cleaning by simultaneously supplying an inert gas from a plurality of inert gas supply units to each of the plurality of gas supply regions and a cleaning gas from a cleaning gas supply unit different from the first and second processing as supply units to all of the plurality of gas supply regions, independently controlling a flow rate of the inert gas supplied from each of the plurality of inert gas supply units to each of the plurality of gas supply regions, and controlling a density of the cleaning gas in each of the plurality of gas supply regions.

7. The substrate processing method of claim 6, wherein the cleaning gas is supplied from the cleaning gas supply unit to the plurality of gas supply regions through a cleaning gas supply hole located at the center of the processing chamber.

* * * * *